(12) United States Patent
Passamani

(10) Patent No.: US 11,336,293 B1
(45) Date of Patent: May 17, 2022

(54) DIGITAL TO ANALOG CONVERTER LOCAL OSCILLATOR TRACKING SYSTEMS AND METHODS

(71) Applicant: Apple Inc., Cupertino, CA (US)

(72) Inventor: Antonio Passamani, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/210,471

(22) Filed: Mar. 23, 2021

(51) Int. Cl.
*H03M 1/66* (2006.01)
*H03B 5/02* (2006.01)

(52) U.S. Cl.
CPC .............. *H03M 1/66* (2013.01); *H03B 5/02* (2013.01)

(58) Field of Classification Search
CPC .................................. H03M 1/66; H03B 5/02
USPC ......................................................... 341/144
See application file for complete search history.

(56) References Cited

U.S. PATENT DOCUMENTS

| 7,327,992 | B2 | 2/2008 | Earls et al. |
|---|---|---|---|
| 8,712,350 | B2 | 4/2014 | Frambach |
| 8,847,806 | B2 * | 9/2014 | Kuttner ................... H03M 1/66 341/144 |
| 9,459,295 | B2 | 10/2016 | Wertz |
| 9,571,120 | B2 | 2/2017 | Kuttner et al. |
| 2020/0343903 | A1 * | 10/2020 | Moreira ................ H03M 1/747 |

* cited by examiner

*Primary Examiner* — Khai M Nguyen
(74) *Attorney, Agent, or Firm* — Fletcher Yoder P.C.

(57) ABSTRACT

An electronic device may include digital circuitry that operates via digital signals and a digital to analog converter (DAC) to convert a digital signal into a modulated analog signal. The DAC may include multiple unit cells to generate an analog signal and multiple local oscillator (LO) tiles to modulate the analog signal and generate the modulated analog signal. The electronic device may also include LO circuitry to dynamically adjust an LO enable signal based at least in part on the digital signal. The LO enable signal may enable a reduced number of LO tiles supporting one or more respective sets of unit cells operatively enabled based on the digital signal.

25 Claims, 17 Drawing Sheets

DIGITAL TO ANALOG CONVERTER LOCAL OSCILLATOR TRACKING SYSTEMS AND METHODS

BACKGROUND

This disclosure generally relates to digital to analog converters (DACs).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. Additionally or alternatively, DACs may be used to drive pixels of an electronic display at specific voltages based on digitally coded image data to produce the specific luminance level outputs to display an image. In some scenarios, a DAC may use one or more unit cells that, in the aggregate, form the analog output voltage. Additionally, a local oscillator may be used to modulate the analog output. However, providing the local oscillator for unit cells not currently in use may draw additional power and decrease efficiency.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An electronic device may use one or more digital to analog converters (DACs) to convert digitally coded data (e.g., coded via binary code, grey-code, thermometer code, etc.) to a corresponding analog output voltage. In general, DACs may generate an analog electrical signal by switching on/off one or more unit cells outputting a unit level current or voltage that, in the aggregate, forms the analog electrical signal. Additionally, in some scenarios, a DAC may use a local oscillator (LO) to modulate the analog output voltage. For example, the LO may be utilized as a carrier frequency to be combined with the output voltages of the unit cells for use in radio frequency (RF) modulation.

In some embodiments, the DAC may utilize LO sub-circuits, also known as tiles, to power the modulation of one or more unit cells. For example, LO tiles may be individually controlled to supply modulation to several unit cells. However, since some unit cells may be deactivated for certain analog output voltages, powering down some LO tiles while not in use may increase power efficiency. By tracking the amount of LO tiles that correspond to the enabled unit cells, excess LO tiles may be deactivated.

Moreover, multiple different types of LO tracking may be used, separately or in conjunction with one another. In some embodiments, the LO tracking may be selectively turned on or off and/or the type of LO tracking may be selected depending on a current implementation. For example, in some scenarios, switching on/off LO tiles may introduce noise in the analog output voltage, and the different types of LO tracking discussed herein may provide balance between power savings and acceptable (e.g., depending on implementation) noise.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
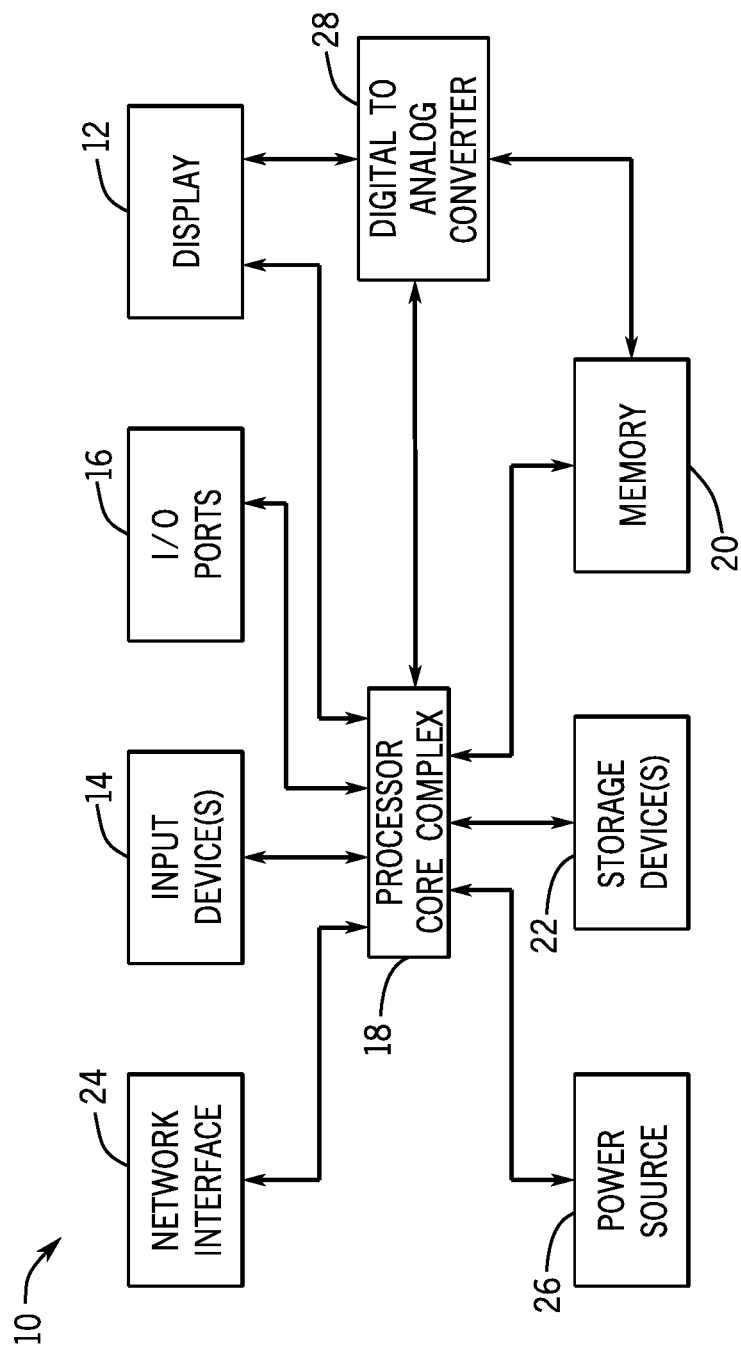
FIG. 1 is a block diagram of an electronic device that includes a digital to analog converter, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

An electronic device may use one or more digital to analog converters (DACs) to convert digitally coded data (e.g., coded via binary code, grey-code, thermometer code, etc.) to a corresponding analog output voltage. Some DACs may generate an analog electrical signal by switching on one or more unit cells outputting a unit level current or voltage that, in the aggregate, forms the analog electrical signal. Additionally, in some scenarios, a DAC may use a local oscillator (LO) to modulate the analog output voltage. For example, the LO may be combined with the output voltages of the unit cells for use in radio frequency (RF) modulation.

In some embodiments, the DAC may utilize LO sub-circuits, also known as tiles, to power the modulation of one or more unit cells. For example, LO tiles may be individually controlled to supply modulation to several unit cells. However, since some unit cells may be deactivated for certain analog output voltages, powering down some LO tiles while not in use may increase power efficiency. By tracking the amount of LO tiles that correspond to the enabled unit cells, excess LO tiles may be deactivated, saving power.

Moreover, multiple different types of LO tracking may be used, separately or in conjunction with one another. In some embodiments, dynamic LO tracking may be selectively turned on or off and/or the type of dynamic LO tracking may be selected depending on a current implementation. For example, static tracking may be associated with increased power usage, and dynamic LO tracking may be selectively turned on to reduce the number of LO tiles at certain times (e.g., based on the number of utilized unit cells) to save power. In some embodiments, selectively activating dynamic LO tracking, as opposed to static tracking, may be based on a preset configuration, the digital signal, a derivative of (e.g., statistic relating to) the digital signal, a key performance indicator (KPI), or a combination thereof. Moreover, in some scenarios, switching on/off LO tiles may introduce noise in the analog output voltage, and the different types of LO tracking discussed herein may provide balance between power savings and acceptable (e.g., depending on implementation) noise. Furthermore, selection of static, dynamic, and/or the type of dynamic tracking may be based on a mode request such as a high performance mode request, a low power mode request, or an intermediate mode request.

As discussed herein, multiple different types of LO tracking such as static tracking, dynamic tracking, and/or look-ahead tracking may be used to determine which LO tiles are to be enabled. Additionally, in some embodiments, the LO tracking circuitry may include techniques for smoothing the enabling/disabling of LO tiles, which may lead to decreased noise. For example, LO tiles may be enabled/disabled in stages and/or utilize one or more bleeder circuits to reduce jumps in current draw.

While the present techniques concerning LO tracking may be implemented in any suitable DAC, including a column and line DAC, in some embodiments, a fractal arrangement of unit cells/LO tiles and/or the transmission lines thereto into branches may assist in unifying the data path length to each of the unit cells, which may result in increased speed (e.g., operating frequency) of the DAC, increased linearity, and/or potential power savings. For example, as opposed to column and line DACs, where the data path to different unit cells may vary, a fractal DAC may have a static path length for the incoming data to each of the unit cells and/or LO tiles. In other words, each branch of the fractal layout tree may have equal length from the input to the unit cells and/or LO tiles. As such, there is reduced (e.g., minimized) waiting between moments when different unit cells and/or LO tiles are turned on for a given data value.

Additionally, the simplified distribution (e.g., via sequential decision units) of the incoming data to the unit cells may be simplified by limiting or eliminating gate cells and/or reprocessing or recombining of the data. This may further increase speed capabilities (e.g., operating frequency) and/or linearity (e.g., decreased differential nonlinearity (DNL) and/or integral nonlinearity (INL)) of the DAC. Moreover, due to the sequential nature of the decision units governing the unit cells, some signals (e.g., a clock signal, a phase signal, etc.) may be turned off when it is known or expected that no further unit cells will be needed in a particular branch yielding increased power savings. Similarly, in some embodiments, the LO signal and/or an LO enable signal (e.g., for enabling the LO tiles) may benefit from the simplified distribution (e.g., via branches) of the fractal layout. For example, the LO signal may only be sent to LO tiles that are active and/or multiple LO tiles may be disabled at a "higher" branch, which may further increase power efficiency.

To help illustrate, an electronic device 10, which includes an electronic display 12, is shown in FIG. 1. As will be described in more detail below, the electronic device 10 may be any suitable electronic device 10, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

The electronic device 10 may include one or more electronic displays 12, one or more input devices 14, one or more input/output (I/O) ports 16, a processor core complex 18 having one or more processor(s) or processor cores, local memory 20, a main memory storage device 22, a network interface 24, a power source 26, and one or more digital to analog converters (DACs) 28. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 20 and the main memory storage device 22 may be included in a single component. Additionally or alternatively, a DAC 28 may be included in the electronic display 12, the network interface 24 and/or other circuitry.

The processor core complex 18 may be operably coupled with local memory 20 and the main memory storage device 22. Thus, the processor core complex 18 may execute instructions stored in local memory 20 and/or the main memory storage device 22 to perform operations, such as generating and/or transmitting image data. As such, the processor core complex 18 may include one or more general purpose microprocessors, one or more application specific integrated circuits (ASICs), one or more field programmable logic arrays (FPGAs), or any combination thereof.

In addition to instructions, the local memory 20 and/or the main memory storage device 22 may store data to be processed by the processor core complex 18. Thus, in some embodiments, the local memory 20 and/or the main memory storage device 22 may include one or more tangible, non-transitory, computer-readable mediums. For example, the local memory 20 may include random access memory (RAM) and the main memory storage device 22 may include read only memory (ROM), rewritable non-volatile memory such as flash memory, hard drives, optical discs, and/or the like.

The processor core complex 18 is also operably coupled with the network interface 24. In some embodiments, the network interface 24 may facilitate data communication with another electronic device and/or a communication network. For example, the network interface 24 (e.g., a radio frequency (RF) system) may enable the electronic device 10 to communicatively couple to a personal area network (PAN), such as a Bluetooth network, a local area network (LAN), such as an 802.11x Wi-Fi network, a mmWave network, and/or a wide area network (WAN), such as a 4G or LTE cellular network. In some embodiments, the network interface 24 may utilize one or more DACs 28 to generate analog signals for transmission via an RF system. For example, the DAC 28 may generate analog signals from digital data to provide transmission signals that may be amplified and transmitted (e.g., via one or more antennas).

The power source 26 may provide electrical power to one or more components in the electronic device 10, such as the processor core complex 18, the electronic display 12, and/or the DAC 28. Thus, the power source 26 may include any suitable source of energy, such as a rechargeable lithium polymer (Li-poly) battery and/or an alternating current (AC) power converter. I/O ports 16 may enable the electronic device 10 to interface with other electronic devices. For example, when a portable storage device is connected, the I/O port 16 may enable the processor core complex 18 to communicate data with the portable storage device.

The input devices 14 may facilitate user interaction with the electronic device 10 by receiving user inputs. Thus, an input device 14 may include a button, a keyboard, a mouse, a trackpad, and/or the like. An input device 14 may include touch-sensing components in the electronic display 12. In such embodiments, the touch sensing components may receive user inputs by detecting occurrence and/or position of an object touching the surface of the electronic display 12.

The electronic display 12 may control light emission from its display pixels (e.g., via one or more DACs 28) to present visual representations of information, such as a graphical user interface (GUI) of an operating system, an application interface, a still image, or video content, by displaying frames based at least in part on corresponding image data (e.g., image pixel data corresponding to individual pixel positions). The electronic display 12 may take the form of a liquid crystal display (LCD), a light emitting diode (LED) display, an organic light emitting diode (OLED) display, a plasma display, or the like.

The electronic display 12 may display images based at least in part on image data received from an image data source, such as the processor core complex 18 and/or the network interface 24, an input device 14, and/or an I/O port 16. The image data source may generate source image data to create a digital representation of the image to be displayed. In other words, the image data is generated such that the image view on the electronic display 12 accurately represents the intended image. Image data may be processed before being supplied to the electronic display 12, for example, via a display pipeline implemented in the processor core complex 18 and/or image processing circuitry.

The display pipeline may perform various processing operations, such as spatial dithering, temporal dithering, pixel color-space conversion, luminance determination, luminance optimization, image scaling, and/or the like. Based on the image data from the image data source and/or processed image data from the display pipeline, target luminance values for each display pixel may be determined. Moreover, the target luminance values may be mapped to analog voltage values (e.g., generated via one or more DACs 28), and the analog voltage value corresponding to the target luminance for a display pixel at a particular location may be applied to that display pixel to facilitate the desired luminance output from the display. For example, a first display pixel desired to be at a lower luminance output may have a lower voltage applied than a second display pixel desired to be at a higher luminance output.

Figure 2:
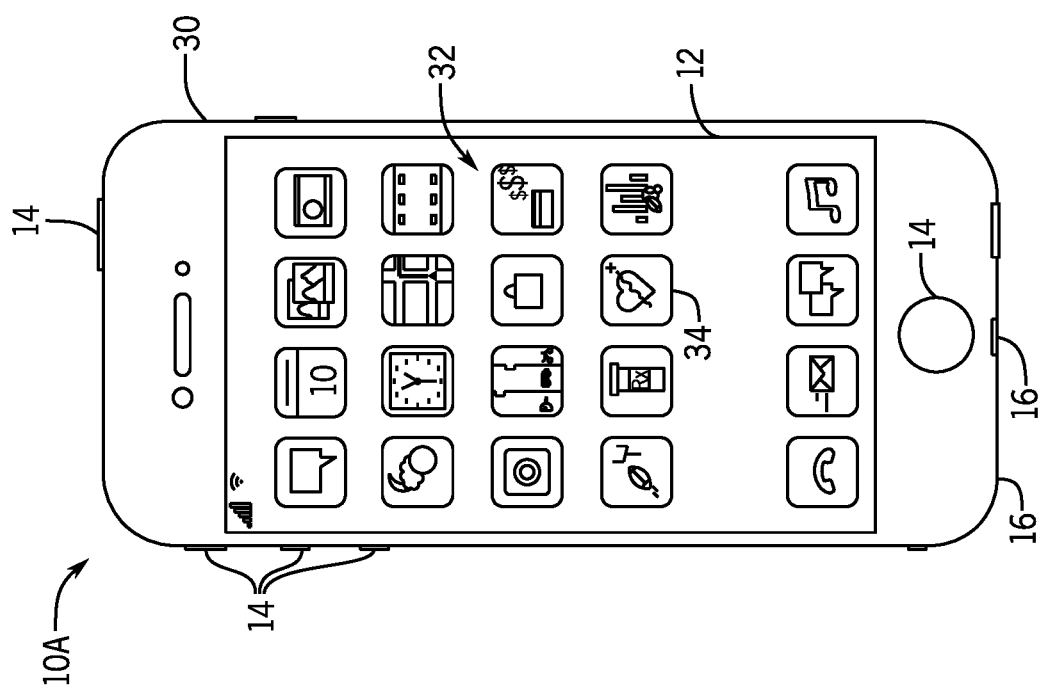
FIG. 2 is an example of the electronic device of FIG. 1, in accordance with an embodiment.

As described above, the electronic device 10 may be any suitable electronic device. To help illustrate, one example of a suitable electronic device 10, specifically a handheld device 10A, is shown in FIG. 2. In some embodiments, the handheld device 10A may be a portable phone, a media player, a personal data organizer, a handheld game platform, and/or the like. For illustrative purposes, the handheld device 10A may be a smart phone, such as an iPhone® model available from Apple Inc.

The handheld device 10A includes an enclosure 30 (e.g., housing). The enclosure 30 may protect interior components from physical damage and/or shield them from electromagnetic interference. The enclosure may 30 surround the electronic display 12. In the depicted embodiment, the electronic display 12 is displaying a graphical user interface (GUI) 32 having an array of icons 34. By way of example, when an icon 34 is selected either by an input device 14 or a touch-sensing component of the electronic display 12, an application program may launch.

Input devices 14 may be accessed through openings in the enclosure 30. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. The I/O ports 16 may be accessed through openings in the enclosure 30.

Figure 3:
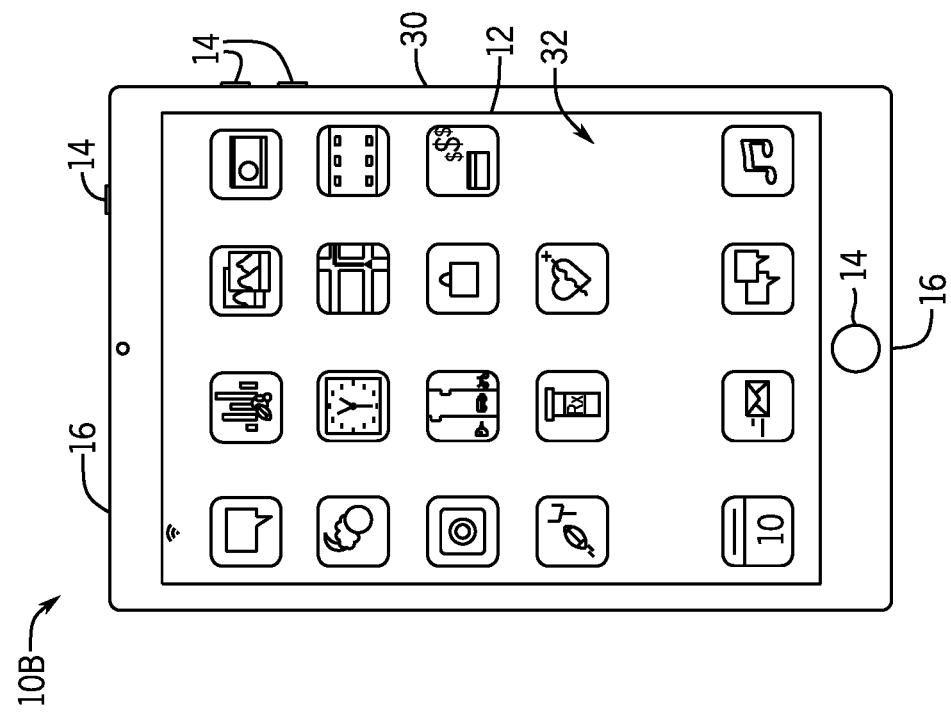
FIG. 3 is another example of the electronic device of FIG. 1, in accordance with an embodiment.
Figure 4:
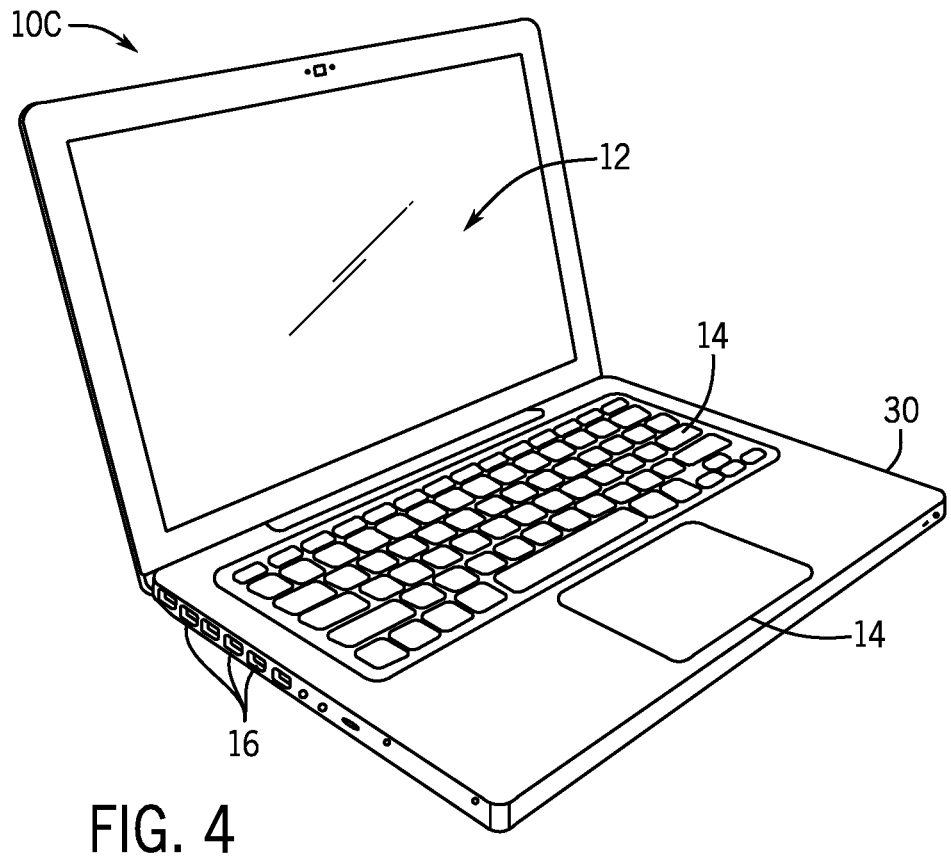
FIG. 4 is another example of the electronic device of FIG. 1, in accordance with an embodiment.
Figure 5:
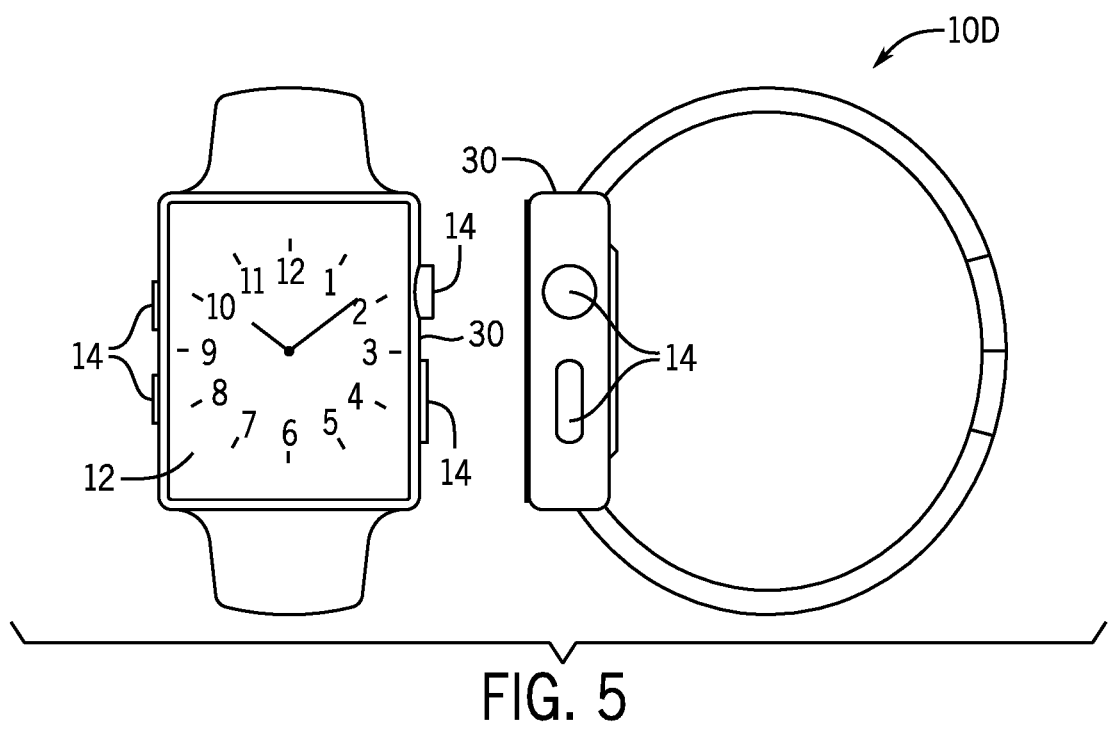
FIG. 5 is another example of the electronic device of FIG. 1, in accordance with an embodiment.

Another example of a suitable electronic device 10, specifically a tablet device 10B, is shown in FIG. 3. For illustrative purposes, the tablet device 10B may be any iPad® model available from Apple Inc. A further example of a suitable electronic device 10, specifically a computer 10C, is shown in FIG. 4. For illustrative purposes, the computer 10C may be any Macbook® or iMac® model available from Apple Inc. Another example of a suitable electronic device 10, specifically a watch 10D, is shown in FIG. 5. For illustrative purposes, the watch 10D may be any Apple Watch® model available from Apple Inc. As depicted, the tablet device 10B, the computer 10C, and the watch 10D each also includes an electronic display 12, input devices 14, I/O ports 16, and an enclosure 30.

As described above, an electronic device 10 may utilize a DAC 28 to generate analog output signals from digital signals. For example, the DAC 28 may be used to generate analog signals for transmission via the network interface 24 (e.g., an RF system), to generate analog output signals for display pixels to facilitate illumination at a target luminance, and/or elsewhere in the electronic device. To help illustrate, FIGS. 6 and 7 include potential uses for a DAC 28 in an electronic device 10. As should be appreciated, although the DACs 28 are illustrated as part of a gamma bus 36 in FIG. 6 and as part of the network interface 24 in FIG. 7, these are provided as a non-limiting examples, and the techniques disclosed herein may be applied to DACs 28 in any suitable implementation.

Figure 6:
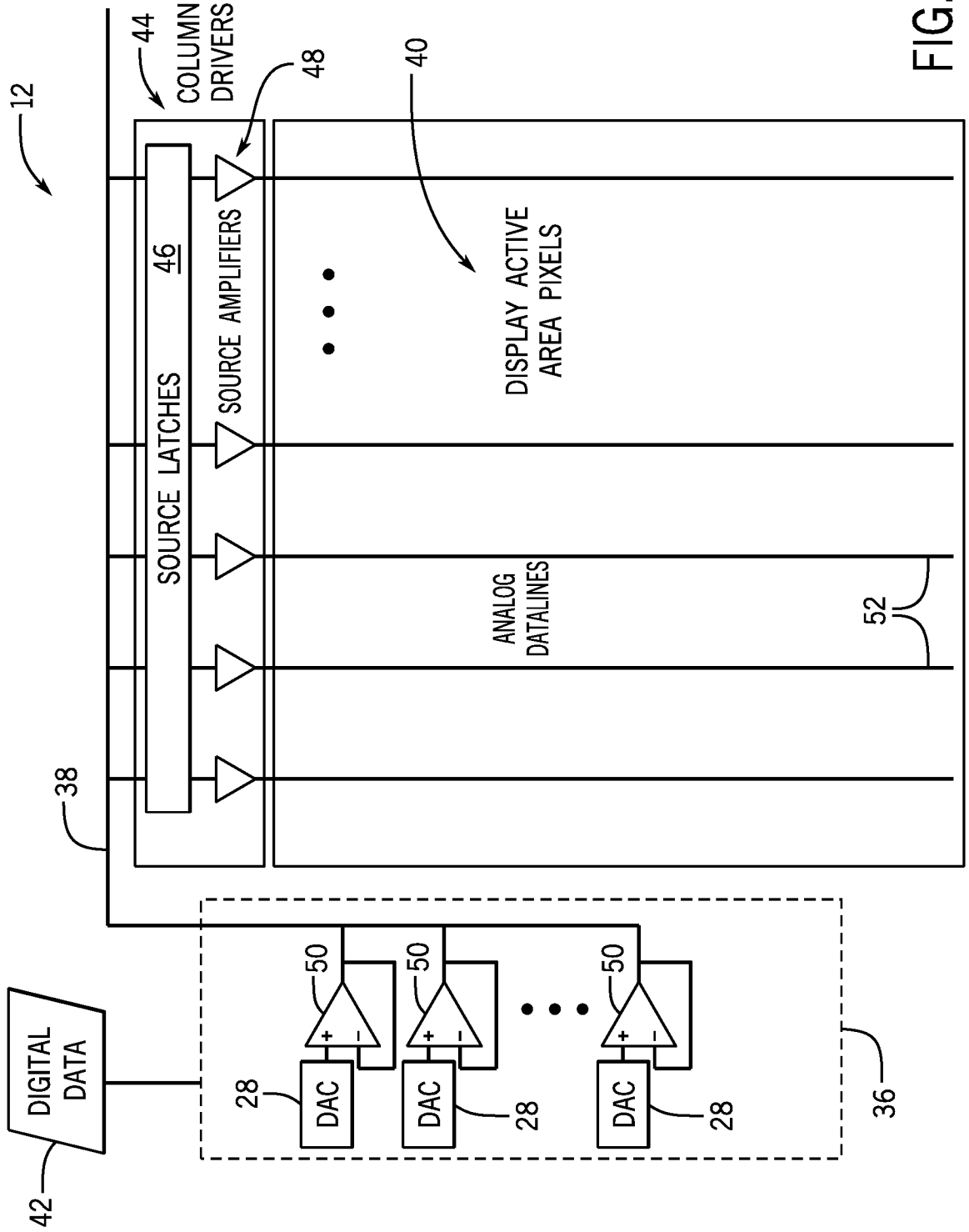
FIG. 6 is a diagrammatic representation of a digital to analog converter in conjunction with an electronic display, in accordance with an embodiment.

A schematic diagram of a portion of the electronic device 10, including a gamma bus 36 with multiple DACs 28 and the electronic display 12, is shown in FIG. 6. In some embodiments, the electronic display 12 may use the analog output voltages 38 of a DAC 28 to power display pixels 40 at various voltages that correspond to different luminance levels. For example, digital data 42 (e.g., digital image data) may correspond to original or processed image data and contain target luminance values for each display pixel 40 in an active area of the electronic display 12. Moreover, display circuitry, such as the column drivers 44, also known as data drivers and/or display drivers, may include source latches 46, source amplifiers 48, and/or any other suitable logic/circuitry to select the appropriate analog voltage and apply power at that voltage to the display pixel 40 to achieve the target luminance output from the display pixel 40.

In some embodiments, power at the output voltage 38 of the DAC 28 may be buffered by one or more buffers 50 (e.g., operational amplifiers) to reduce and/or stabilize the current draw on the output of the DAC 28. Moreover, in some embodiments, the DAC 28 may output a negative voltage relative to a reference point (e.g., ground). In the illustrated example, the buffered output voltage 38 travels down analog datalines 52 to display pixels 40 of the active area.

Figure 7:
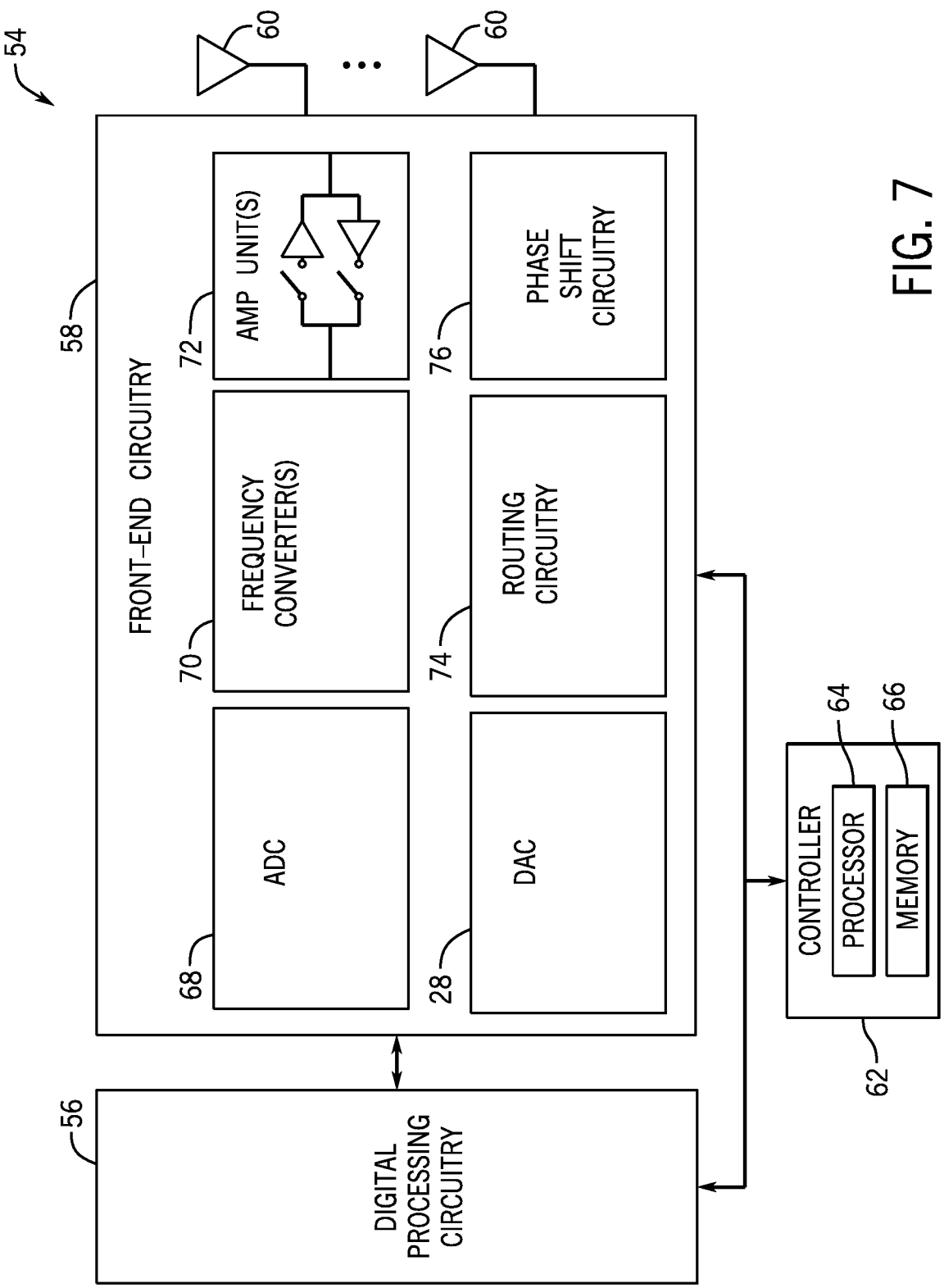
FIG. 7 is a diagrammatic representation of a digital to analog converter in conjunction with front-end circuitry, in accordance with an embodiment.

Additionally or alternatively, the electronic device 10 may utilize a DAC 28 as part of the network interface 24 (e.g., a RF system 54), as shown in FIG. 7. As described above, a radio frequency system 54 may facilitate wirelessly communicating data with other electronic devices and/or a communication network. As in the depicted example, an RF system 54 may include digital processing circuitry 56, front-end circuitry 58, one or more antennas 60, and a controller 62. It should be appreciated that the depicted example is merely intended to be illustrative and not limiting. For example, in other embodiments, a RF system 54 may include a single antenna 60 or more than two antennas 60.

The controller 62 may generally control operation of the RF system 54. Although depicted as a single controller 62, in other embodiments, one or more separate controllers 62 may be used to control operation of the RF system 54. To facilitate controlling operation, the controller 62 may include one or more controller processors 64 and/or controller memory 66. In some embodiments, a controller processor 64 may execute instructions and/or process data stored in the controller memory 66 to determine control commands that instruct the RF system 54 to perform a control action. Additionally or alternatively, a controller processor 64 may be hardwired with instructions that determine control commands when executed. Furthermore, in some embodiments, a controller processor 64 may be included in the processor core complex 18, separate processing circuitry, or both, and the controller memory 66 may be included in local memory 20, a main memory storage device 22, another tangible, non-transitory computer-readable medium, or any combination thereof.

Digital processing circuitry 56 implemented in a RF system 54 may generally operate in a digital domain. In other words, the digital processing circuitry 56 may process data indicated via digital electrical signals, for example, which indicate a "0" bit when the voltage is below a voltage threshold and a "1" bit when the voltage is above the voltage threshold. In some embodiments, the digital processing circuitry 56 may include a modem, a baseband processor, and/or the like. Additionally, in some embodiments, the digital processing circuitry 56 may be communicatively coupled to the processor core complex 18 to enable the electronic device 10 to wirelessly transmit data and/or receive wirelessly transmitted data via the RF system 54.

On the other hand, antennas 60 implemented in a RF system 54 generally operate in an analog domain. For example, an antenna 60 may facilitate wireless data transmission by modulating electromagnetic (e.g., radio) waves based at least in part on an analog electrical signal received from the front-end circuitry 58. Additionally or alternatively, an antenna 60 may facilitate wireless data reception by outputting an analog electrical signal based at least in part on received (e.g., incident) electromagnetic waves.

In the depicted example, the front-end circuitry 58 may be coupled between the digital processing circuitry 56 and the antennas 60 and, thus, operate as an interface between the digital domain and the analog domain. Thus, the front-end circuitry 58 may include an analog-to-digital converter (ADC) 68 that operates to convert an analog electrical signal (e.g., output from an antenna 60) into a digital electrical signal (e.g., to be output to the digital processing circuitry 56). Additionally, the front-end circuitry 58 may include a digital-to-analog converter (DAC) 28 that converts a digital electrical signal (e.g., output from the digital processing circuitry 56) into an analog electrical signal (e.g., to be output to an antenna 60). Moreover, the front-end circuitry 58 may be implemented across multiple integrated circuits (e.g., devices or chips). For example, the analog-to-digital converter 68 and/or the DAC 28 may be implemented in a transceiver integrated circuit.

In addition to the analog-to-digital converter 68 and the DAC 28, as in the depicted example, the front-end circuitry 58 may include one or more frequency converters 70, one or more amplifier units 72, and routing circuitry 74. In some embodiments, the RF system 54 may also include phase shift circuitry 76, for example, to facilitate beam forming techniques.

Figure 8:
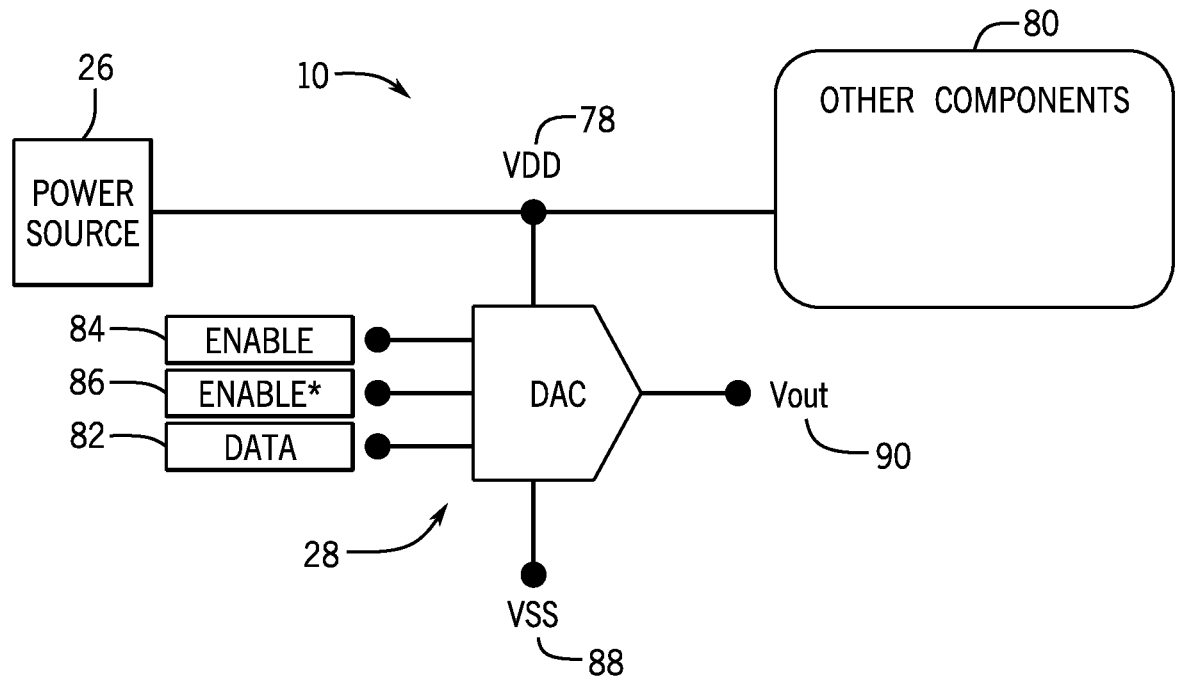
FIG. 8 is a diagrammatic representation a digital to analog converter and other components of an electronic device, in accordance with an embodiment.

FIG. 8 is a diagrammatical view of a DAC 28 of an electronic device 10 in an example environment of the electronic device 10. In some embodiments, the DAC 28 may share a supply voltage (e.g., VDD) 78 with other components 80 of the electronic device 10. For example, the other components 80 may include any powered electronic component of the electronic device 10 operating at or utilizing the supply voltage 78 or a derivative thereof. Moreover, the DAC 28 may receive the digital signal 82 and/or an enable signal 84 and/or a complementary enable signal 86. The enable signal 84 and/or its complementary enable signal 86, may be provided to enable operation of the DAC 28. For example, if the enable signal 84 is logically "low," relative to a reference voltage 88 (e.g., ground or other relative voltage) the DAC 28 may be disabled. On the other hand, if the enable signal 84 is logically "high," (e.g., relative to the reference voltage 88 and/or the supply voltage 78) the DAC 28 may be enabled for operation. In other examples, a logically "high" enable signal 84 may cause the DAC 28 to be disabled and a logically "low" enable signal 84 may cause the DAC 28 to be disabled. Furthermore, the reference voltage 88 (e.g., VSS) may be provided as a reference for the digital signal 82, the enable signal 84, the complementary enable signal 86, the supply voltage 78, the analog output signal 90, or a combination thereof. As should be appreciated, as used herein, signals (e.g., digital signal 82, enable signal 84, complementary enable signal 86, analog output signal 90, etc.) may correspond to voltages or currents relative to a reference and may represent electronically storable, displayable, and/or transmittable data.

As discussed above, the different analog output signals 90 generated by the DACs 28 may correspond to the values of the digital signal 82. The digital signal 82 and corresponding analog output signal 90 may be associated with any suitable bit-depth depending on implementation. For example, in the context of image data and/or signal transmission data, 8-bit digital signal 82 may correspond to 256 different analog reference voltages.

Figure 9:
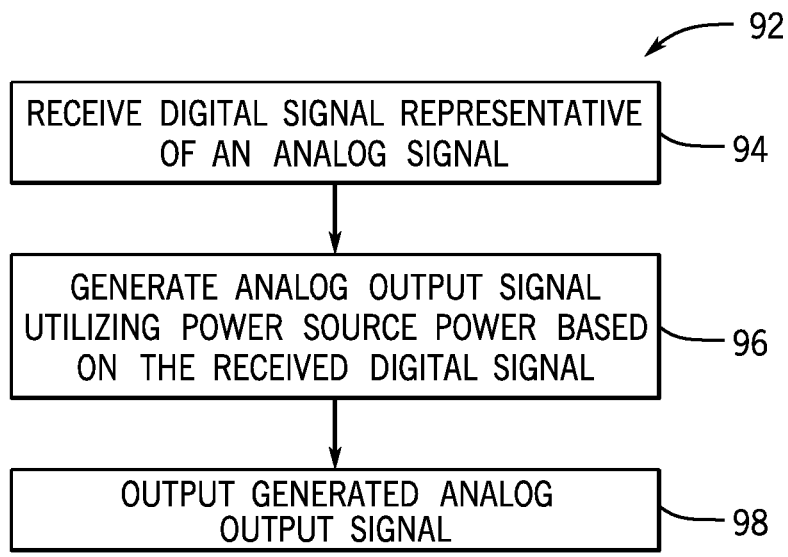
FIG. 9 is a flowchart of an example operation of a digital to analog converter, in accordance with an embodiment.

FIG. 9 is a flowchart 92 for an example operation of the DAC 28. The DAC 28 may receive digital signal 82 representative of an analog signal (process block 94). The DAC 28 may also generate an analog output signal 90, utilizing power from the power source 26, based on the received digital signal 82 (process block 96). The generated analog output signal 90 can then be output from the DAC 28 (processing block 98).

Figure 12:
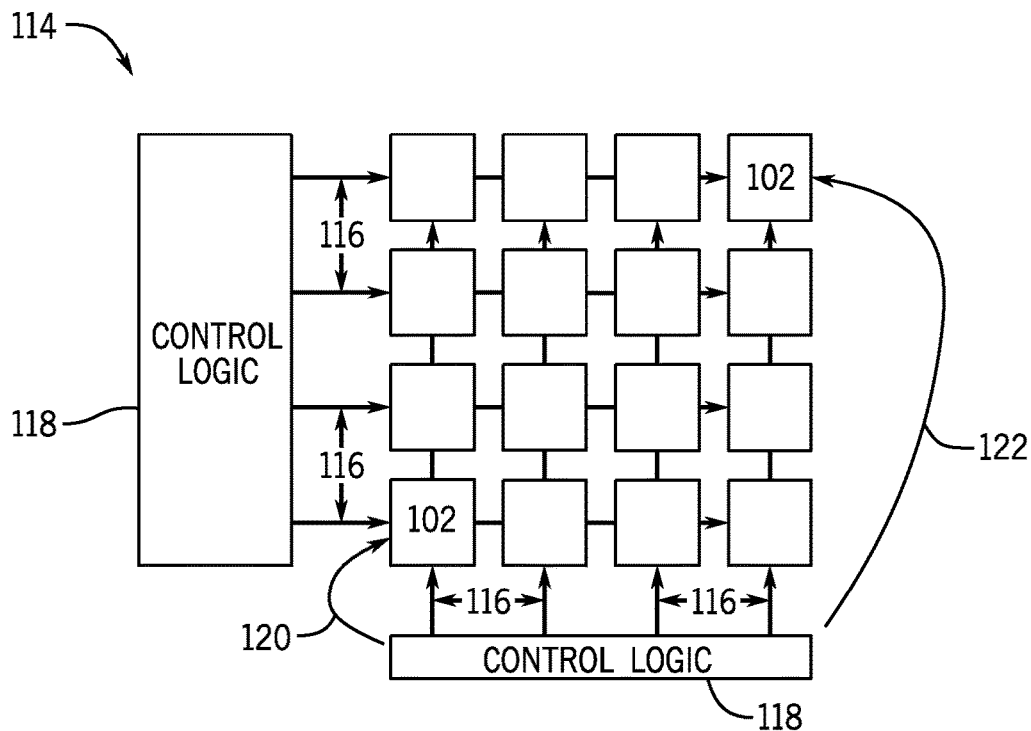
FIG. 12 is a diagrammatic representation of a column and line digital to analog converter, in accordance with an embodiment.

DACs 28 may come in multiple different architectures and physical arrangements. As discussed herein, the techniques of the present disclosure may be utilized in any suitable DAC arrangement such as the fractal DAC 100 of FIG. 10 or the column and line DAC 114 of FIG. 12.

A fractal DAC 100 may include multiple unit cells 102 arranged (e.g., logically and/or physically) in a fractal pattern constructed of fractal blocks 104. For example, the pattern may be replicated (e.g., to increase the size of the fractal DAC 100) by replacing each unit cell 102 with a fractal block 104, maintaining symmetry. In the illustrated example, the fractal DAC 100 includes sixteen fractal blocks 104 of four unit cells 102, which may correspond to, for example, sixty-four different (zero or non-zero) analog output signals 90. However, larger fractal DACs 100 may be envisioned by replacing each unit cell 102 with a fractal block 104, increasing the size of the fractal DAC 100 by four each time to maintain 4× unit cells 102. As should be appreciated, the size of the fractal DAC 100 may depend on implementation factors such as desired granularity of the analog output signal 90. Furthermore, different size fractal blocks 104 (e.g., half a fractal block 104) may be used to achieve different numbers of total unit cells 102 (e.g., 2× number of unit cells 102 for fractal blocks 104 of size two unit cells 102). Moreover, in some embodiments, one or more unit cells 102 may be representative of fractional unit cells (e.g., outputting 0.5 or 0.25 of a unit voltage or current) to further increase granularity, dynamic range extension, and/or as an offset to decrease differential nonlinearity (DNL) and/or integral nonlinearity (INL).

In some embodiments, the multiple nested fractal blocks 104 may be continuously split into symmetric branches by decision units 106 (e.g., 106A, 106B, 106C, 106D, etc.) until reaching the unit cells 102. For a given branch of the fractal DAC 100, sequential decision units 106 may be used to interpret the digital signal 82 and direct enable/disable signals to the corresponding unit cells 102 to generate the analog output signal 90. Additionally, although the digital signal 82 is depicted as a single line, in some embodiments, the digital signal 82 may include multiple data buses running in parallel through the fractal DAC 100. For example, the multiple data buses may include data for multiple phases and/or polarity (e.g., negative and positive). As such, the fractal DAC 100 and the decision units 106 may operate on multiple digital signals 82 in parallel to control outputs of the unit cells 102.

Figure 11:
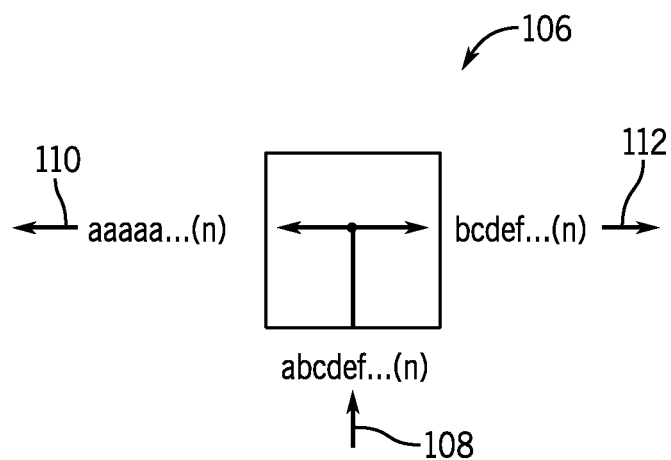
FIG. 11 is a diagrammatic representation of a decision unit of the fractal digital to analog converter of FIG. 10, in accordance with an embodiment.

To help illustrate, FIG. 11 is an example decision unit 106 receiving an incoming signal 108 of n bits. In some embodiments the incoming signal 108 (e.g., digital signal 82) is a binary signal that is decoded step-by-step by the decision units 106 such that the aggregate of the signals reaching the unit cells 102 forms a thermometric signal. For example, the aggregate thermometric signal for a binary incoming signal 108 of "10" may be represented as "0011." As the decision units 106 decipher and pass on certain portions of the incoming signal 108 along different routes, the unit cells 102 may eventually end up with respective portions of the thermometric digital signal (e.g., with logical "1" going to two unit cells 102 for activation and logical "0" going to two different unit cells for deactivation). For example, the incoming signal 108 may have n-bits (e.g., abcdef . . . , where each letter is representative of a logical value in a binary format, as in the illustrated example). Each decision unit 106 may take the most significant bit (MSb) of the incoming signal 108, repeat it n−1 times, and output a MSb signal 110 having the MSb of the incoming signal 108 repeated n−1 times. Additionally, the decision unit 106 may output a least significant bit (LSb) signal 112 including the remainder of the incoming signal 108, without the MSb, having n−1 total bits.

As should be appreciated, the MSb of a binary signal is representative of half of the value of the incoming signal 108. As such, if the MSb (e.g., at decision unit 106A) is a logical "1", the repeated logical "1" will be propagated down half of the branches of the fractal DAC 100, reducing the bit-depth by one with each subsequent decision unit 106, to enable half of the unit cells 102 downstream from the initial decision unit 106 (e.g., decision unit 106A). The remaining half of the unit cells 102 may be enabled or disabled according to the LSb signal 112 having the remainder of the incoming signal 108. Using similar logic, the LSb signal 112 from an initial decision unit 106 (e.g., decision unit 106A) may be the incoming signal 108 for a subsequent decision unit 106 (e.g., decision unit 106B) and so forth. Additionally or alternatively, decision units 106 may include logic gates (e.g., NAND, NOR, or other suitable logic) to keep unit cells 102 active while ramping up. This may allow for unit cells 102 to be activated contiguously, and may reduce noise associated with activation and deactivation of unit cells 102.

Figure 10:
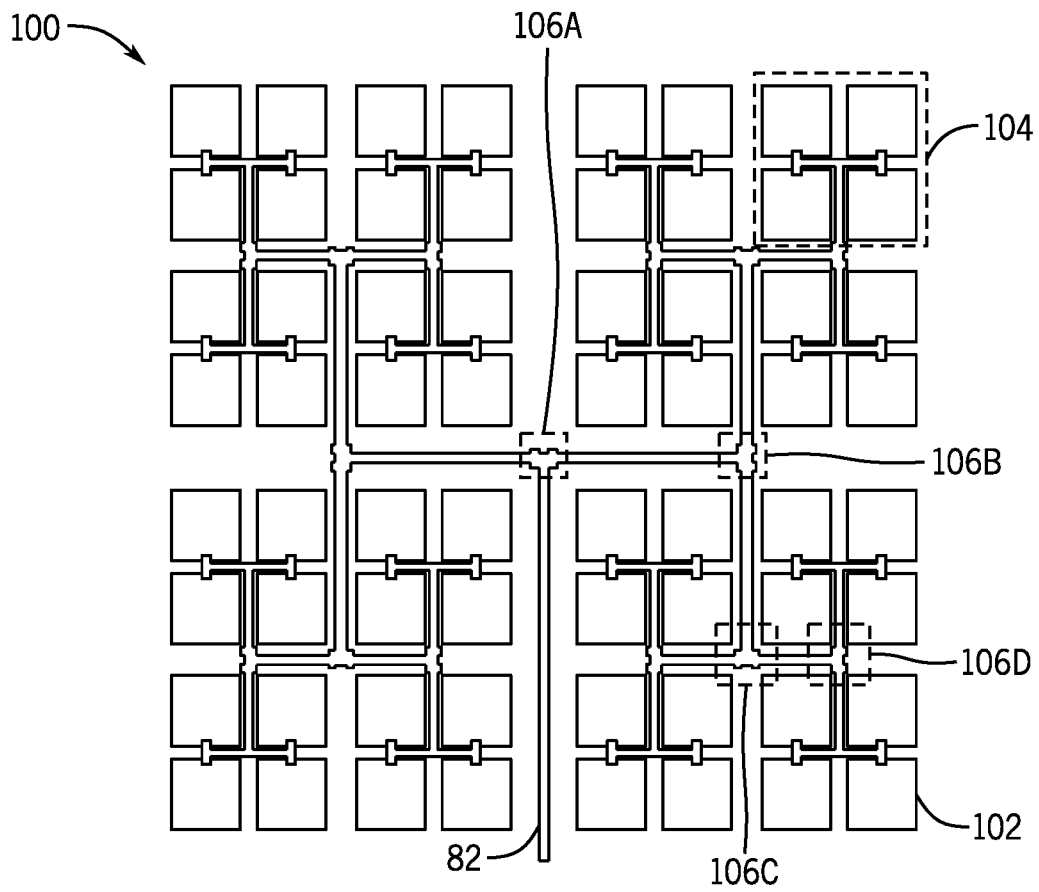
FIG. 10 is a diagrammatic representation of a fractal digital to analog converter, in accordance with an embodiment.

Additionally, although depicted in FIGS. 10 and 11 as having two outputs (e.g., MSb signal 110 and LSb signal 112), in some embodiments, the decision units 106 may evaluate multiple bits of the incoming signal 108 at the same time. For example, a decision unit 106 may provide four outputs in a quaternary split of the incoming signal 108, effectively combining the efforts of the first two levels of decision units 106 (e.g., decision unit 106A, decision unit 106B, and the decision unit opposite decision unit 106B). In the example of the quaternary split, two outputs may include the MSb signal 110 with a bit depth of n−2, a signal of repeated entries of the second MSb with a bit depth of n−2, and the LSb signal 112 with a bit depth of n−2, having the 2 MSbs removed. As should be appreciated, the number of splits for a single decision unit 106 may vary based on implementation. Furthermore, in some embodiments, the decision units 106 may include multiple incoming signals 108, for example from multiple parallel data buses, and provide either a binary split, a quaternary split, or other split to each incoming signal 108.

As discussed above, the fractal DAC 100 may facilitate decoding of the digital signal 82 (e.g., via the decision units 106) into a thermometric signal dispersed among the unit cells 102. Additionally or alternatively, the digital signal 82 may include a binary signal that is not decoded via the decision units 106. For example, some unit cells 102 may have a binary-sized output that is dependent upon a binary signal. In some embodiments, the binary signal (e.g., a portion of the digital signal 82) may traverse the same path as the decoded thermometric signal and, therefore, have substantially similar arrival time at the binary coded unit cells 102 maintaining synchronicity of the fractal DAC 100. For example, the binary signal may be passed through or bypass the decision units 106 and/or use separate distribution logic following the data path of the fractal DAC 100. The binary coded unit cells 102 use the binary signal to vary the output between zero (e.g., disabled) and a full unit voltage or current (e.g., 0.0, 0.25, 0.5, 0.75, or 1.0 of a unit voltage or current). For example, the binary coded unit cell 102 may include binary interpretation logic to decode the binary signal and enable the binary coded unit cell 102 at an intermediate power level. The binary-sized output of the binary coded unit cells 102 may help increase resolution of the analog output signal 90 by providing increased granularity.

A column and line DAC 114 may include a multitude of control signals 116 from control logic 118 feeding an array of unit cells 102. Moreover, while the control logic 118 of a column and line DAC 114 may be non-uniform and have more complicated control signals 116, the fractal DAC 100, as discussed herein, may include repeated decision units 106 with simplified outputs (e.g., the MSb signal 110 and the LSb signal 112). For example, the control logic 118 of a column and line DAC 114 may incorporate binary to thermometric conversion and/or take into consideration the desired states of multiple individual unit cells 102 simultaneously to determine what control signals 116 would be needed. Furthermore, in some scenarios, a column and line DAC 114 may have shorter paths (e.g., data path 120) and longer paths (e.g., data path 122), whereas a fractal DAC 100 may include data paths that are substantially the same length to each unit cell 102.

Figure 13:
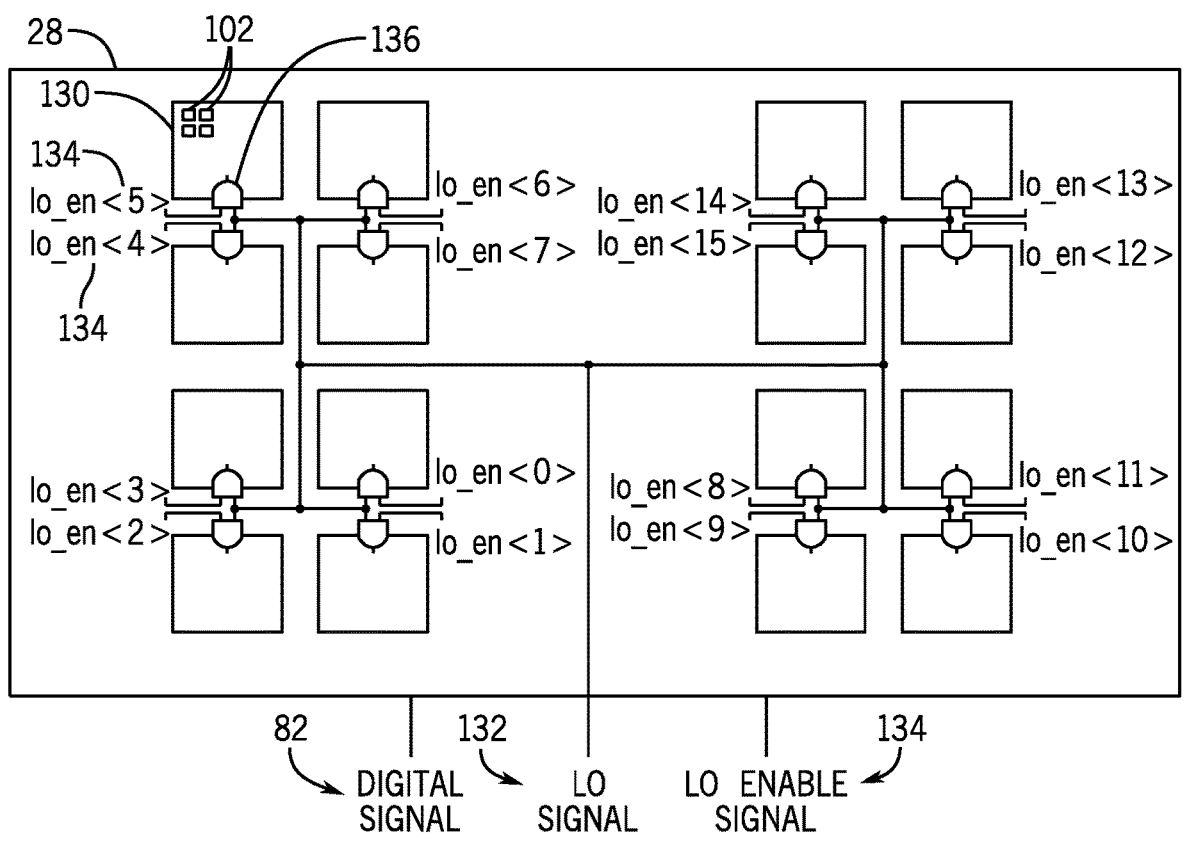
FIG. 13 is a diagrammatic representation of a digital to analog converter having local oscillator tiles, in accordance with an embodiment.

In some embodiments, a DAC 28 may also include LO circuitry, referenced herein as LO tiles 130, that combine an LO signal 132 with the output of one or more unit cells 102, as illustrated in FIG. 13. For example, as the DAC uses the digital signal 82 to activate certain unit cells 102, one or more LO tiles 130 corresponding to the activated unit cells 102 may modulate or otherwise combine the analog output signal 90 with the LO signal 132. As should be appreciated, maintaining power to all of the LO tiles 130 regardless of the digital signal 82 may lead to unnecessary power consumption. Additionally, the LO tiles 130 may be activated or deactivated based on an LO enable signal 134. In some embodiments, LO control logic 136 (e.g., one or more gates, latches, or other circuitry) may provide enablement (e.g., according to the LO enable signal 134) and/or the LO signal 132 to the LO tiles 130 based on the LO enable signal 134. By deactivating LO tiles 130 that are not associated with activated unit cells 102, the DAC 28 may reduce the power consumption of the LO tiles 130 and increase overall power efficiency.

Figure 14:
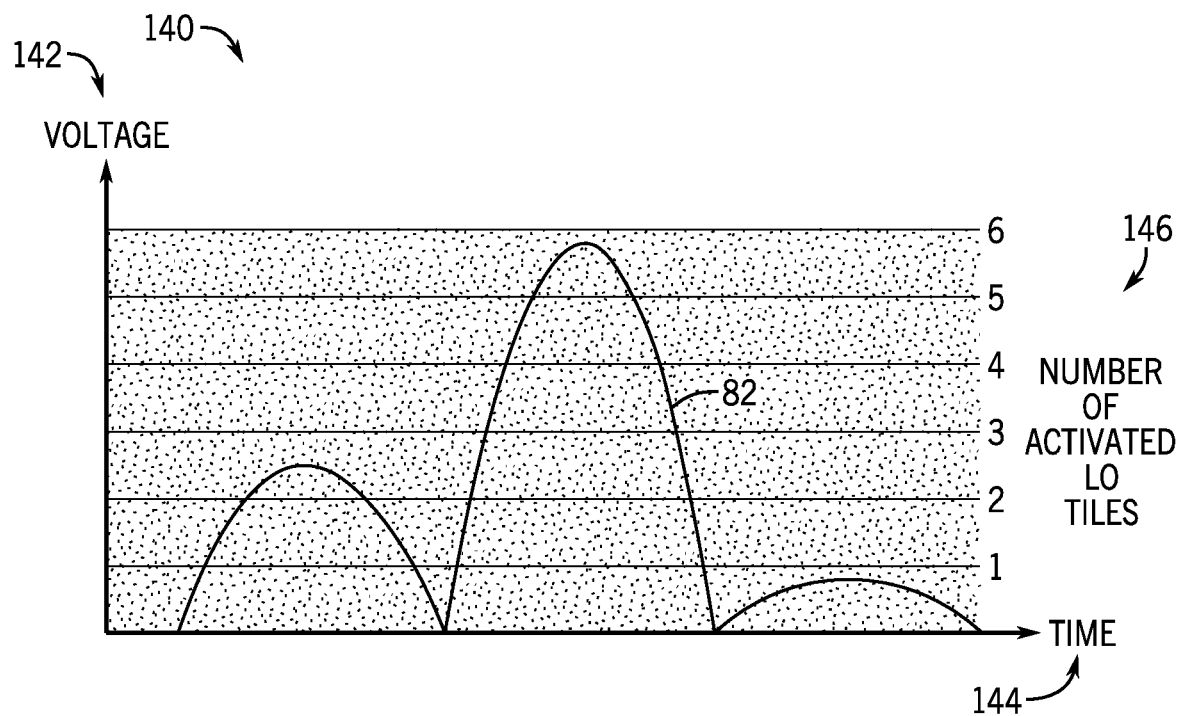
FIG. 14 is a graph of an example digital signal over time and the number of activated local oscillator tiles associated with a static tracking scheme, in accordance with an embodiment.

As discussed above, multiple techniques for LO tracking may be utilized to generate the LO enable signal 134 and/or command the LO tiles 130. For example, static LO tracking may include enabling a certain amount of LO tiles 130 without dynamic adjustment based on the digital signal 82. FIG. 14 is a graph 140 of the representative voltage 142 (i.e., on the y-axis) of an example digital signal 82 over time 144 (i.e., on the x-axis) with the number of activated LO tiles 146 shaded in the y-axis direction to illustrate activation of LO tiles 130 over time 144. Graph 140 illustrates that the digital signal 82 is within the activated number of tiles 146 without adjustment to the activated number of tiles 146. Static LO tracking may include enablement of the same number of activated LO tiles 146 regardless of the digital signal 82, and may be preset (e.g., based on a maximum known digital signal 82) and/or may include enablement of all LO tiles 146. While static LO tracking may provide an analog output signal 90 with minimal noise due to the LO, enabling and maintaining each LO tile 130 regardless of the digital signal 82 may increase power consumption over dynamic LO tracking.

Figure 15:
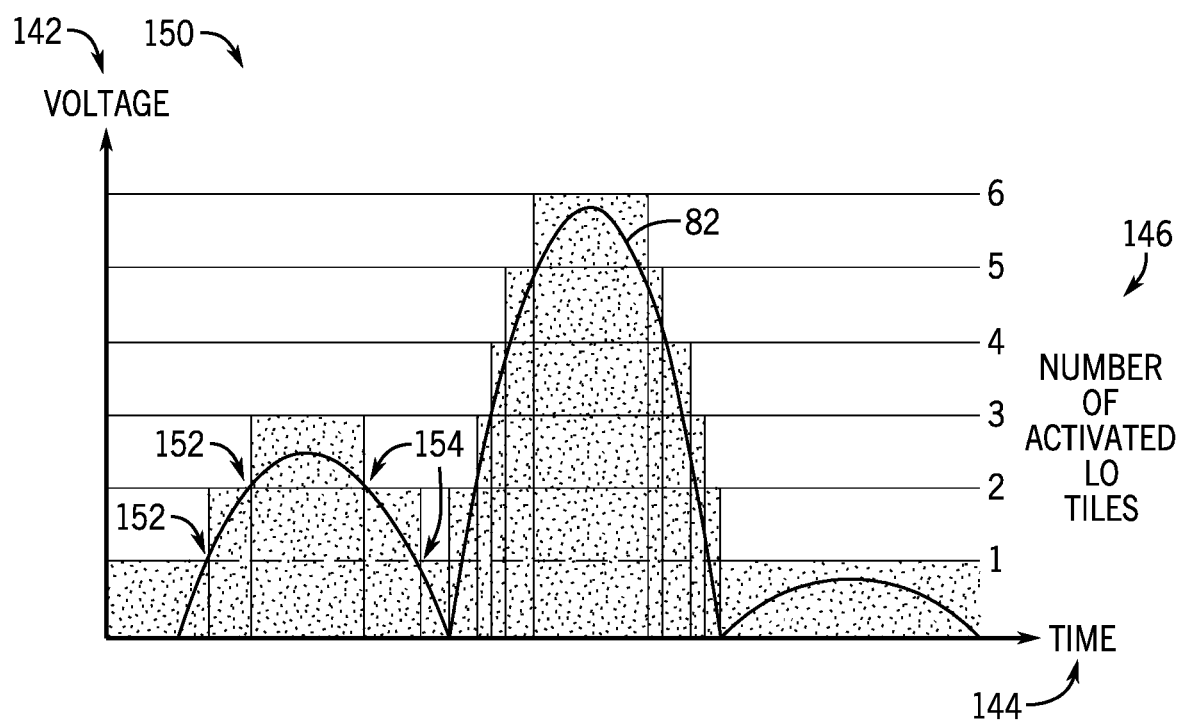
FIG. 15 is a graph of an example digital signal over time and the number of activated local oscillator tiles associated with a dynamic tracking scheme, in accordance with an embodiment.

FIG. 15 is a graph 150 of the representative voltage 142 (i.e., on the y-axis) of an example digital signal 82 over time 144 (i.e., on the x-axis) with the number of activated LO tiles 146 shaded in the y-axis direction according to a dynamic LO tracking scheme. As the digital signal 82 increases, the number of unit cells 102 producing the analog output signal 90 may also increase. Furthermore, as the digital signal 82 increases, the number of unit cells 102 supported by an LO tile 130 may be exceeded, and another LO tile 130 may be enabled at LO tile increase points 152. Additionally, when the digital signal 82 falls beneath the threshold such that an activated LO tile 130 is no longer in use, the number of activated LO tiles 146 may be reduced at LO tile decrease points 154, for power savings. During the dynamic LO tracking illustrated by the graph 150, no additional LO tiles 130 beyond those associated with activated unit cells 102 are activated, reducing the power draw of the DAC 28. As discussed further herein, other dynamic LO tracking schemes may enable additional LO tiles 130 (e.g., buffer tiles) beyond those associated with the activated unit cells 102 while still enabling less than the total number of LO tiles 130.

Figure 16:
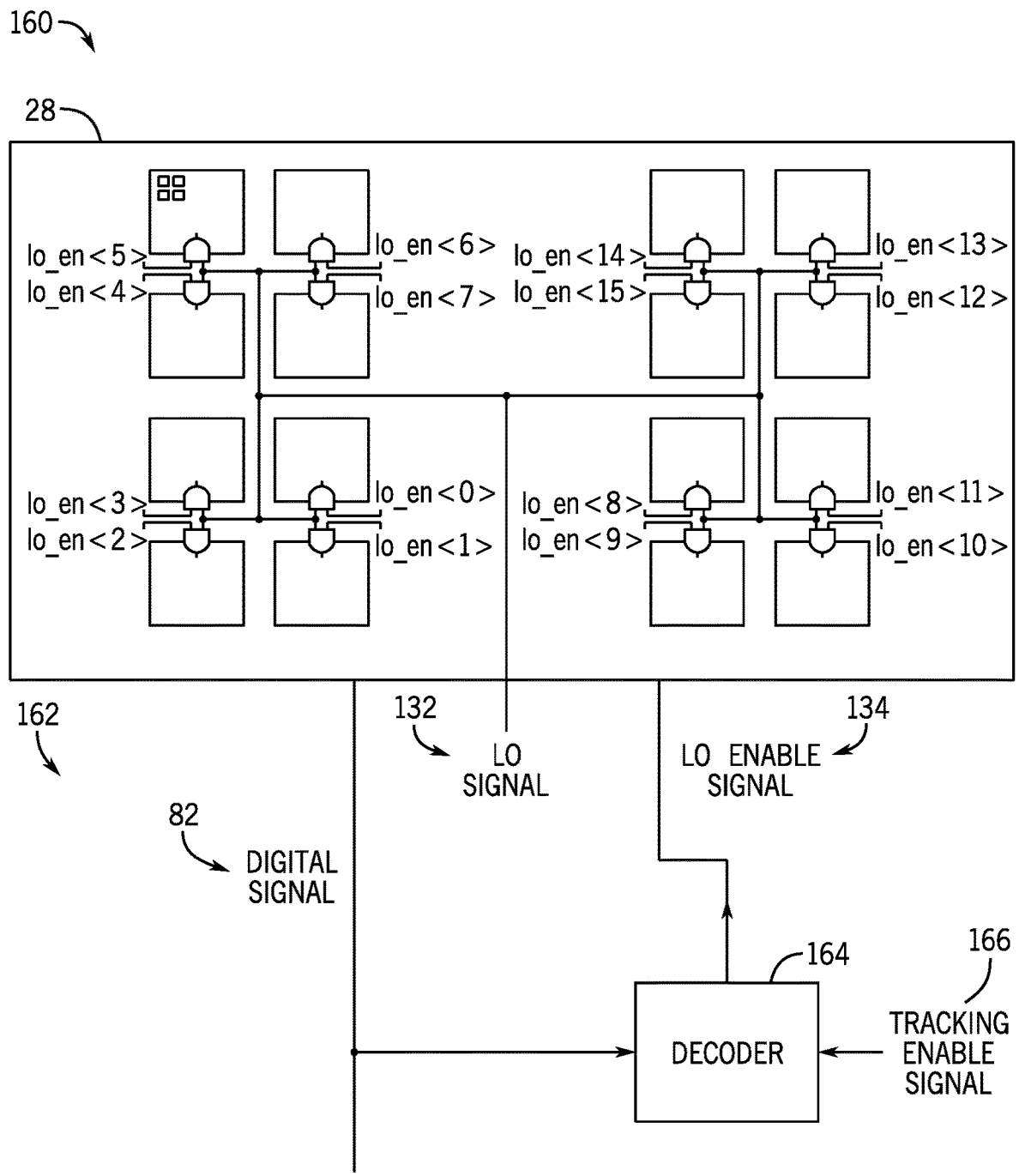
FIG. 16 is a diagrammatic representation of a digital to analog converter and local oscillator tracking circuitry, in accordance with an embodiment.

FIG. 16 is an example circuit diagram 160 of a DAC 28 with LO tracking circuitry 162 arranged to enable dynamic LO tracking. The LO tracking circuitry 162 may include a decoder 164 for determining the LO enable signal 134 from the digital signal 82 or a derivative thereof. In some embodiments, the decoder 164 may include a binary to thermometric decoder. In some embodiments, the decoder 164 receives a portion of the digital signal 82 (e.g., a number of most-significant-bits (MSbs)) and generates the LO enable signal 134 therefrom. For example, each LO tile 130 may be associated with multiple unit cells 102 and, as such, the granularity of the entire digital signal 82 may not be needed.

In some scenarios, toggling increases or decreases in the number of activated LO tiles 146 may introduce noise into the LO signal 132 for unit cells 102 associated with the toggled LO tile 130 and/or other portions of the DAC 28. Additionally, a lack of synchronicity between the unit cell activations and the newly activating LO tile 130 may cause errors if the LO tile 130 is not ready when the unit cell(s) associated therewith are activated. Depending on implementation, it may be desirable to operate in a low power mode or in certain situations and to operate in a high-fidelity mode in other situations. In some embodiments, the LO tracking circuitry 162 may receive a tracking enable signal 166 to enable or disable dynamic LO tracking and alternate between the low power mode and the high-fidelity mode.

Figure 17:
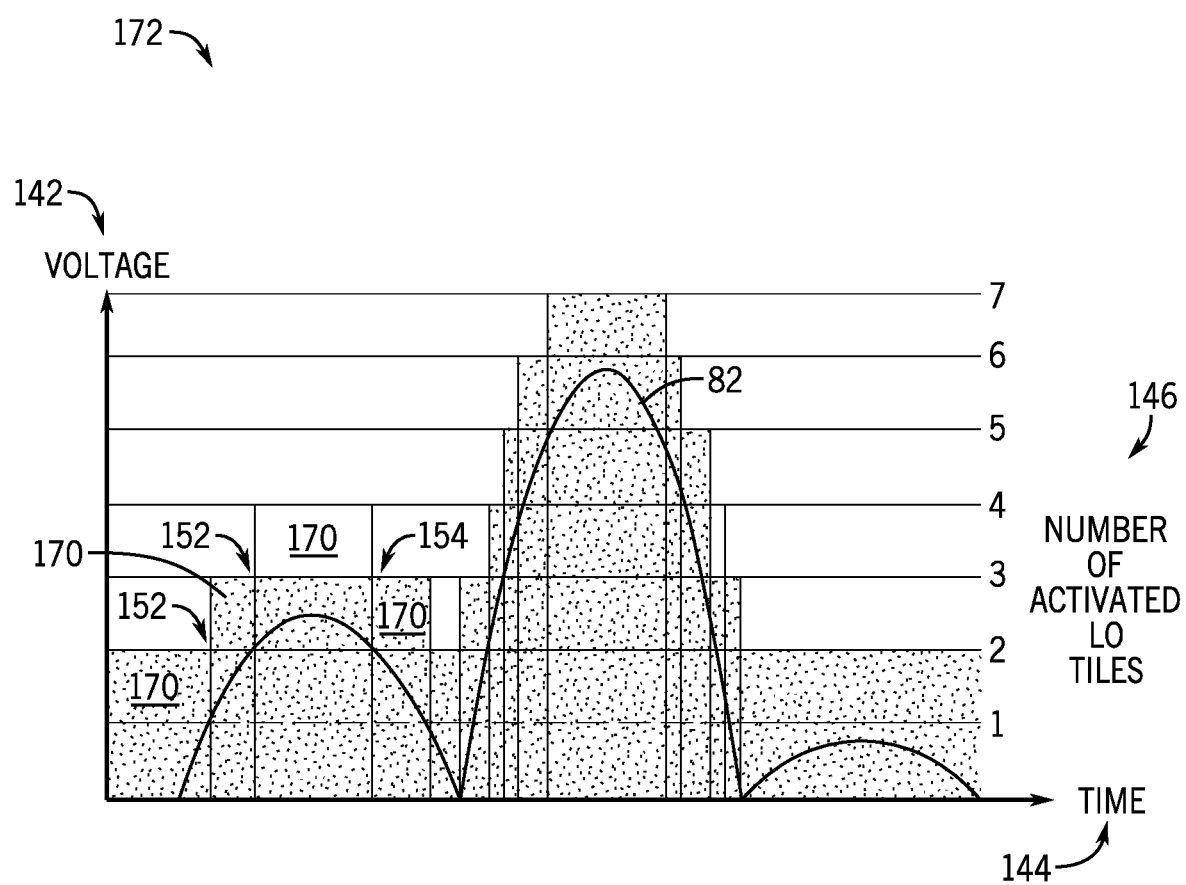
FIG. 17 is a graph of an example digital signal over time and the number of activated local oscillator tiles associated with a dynamic tracking scheme, in accordance with an embodiment.

Additionally or alternatively, the tracking enable signal 166 may enable different aspects of the LO tracking circuitry, or different circuitry altogether, to reduce noise and/or smooth LO tile transitions (e.g., LO tile increase points 152 and LO tile decrease points 154). For example, dynamic LO tracking may be implemented with a +n offset to provide an LO buffer tile 170 above the LO tile requirement associated with the current digital signal 82, as shown by the graph 172 of FIG. 17. The graph 172 illustrates the representative voltage 142 (i.e., on the y-axis) of an example digital signal 82 over time 144 (i.e., on the x-axis) with the number of activated LO tiles 146 shaded in the y-axis direction according to a dynamic LO tracking scheme with a +1 offset. In the depicted example, the LO tile increase points 152 and decrease points 154 increase and decrease the number of activated LO tiles 146 to maintain an additionally activated LO buffer tile 170 over that of the dynamical LO tracking discussed above with reference to FIG. 15.

Figure 18:
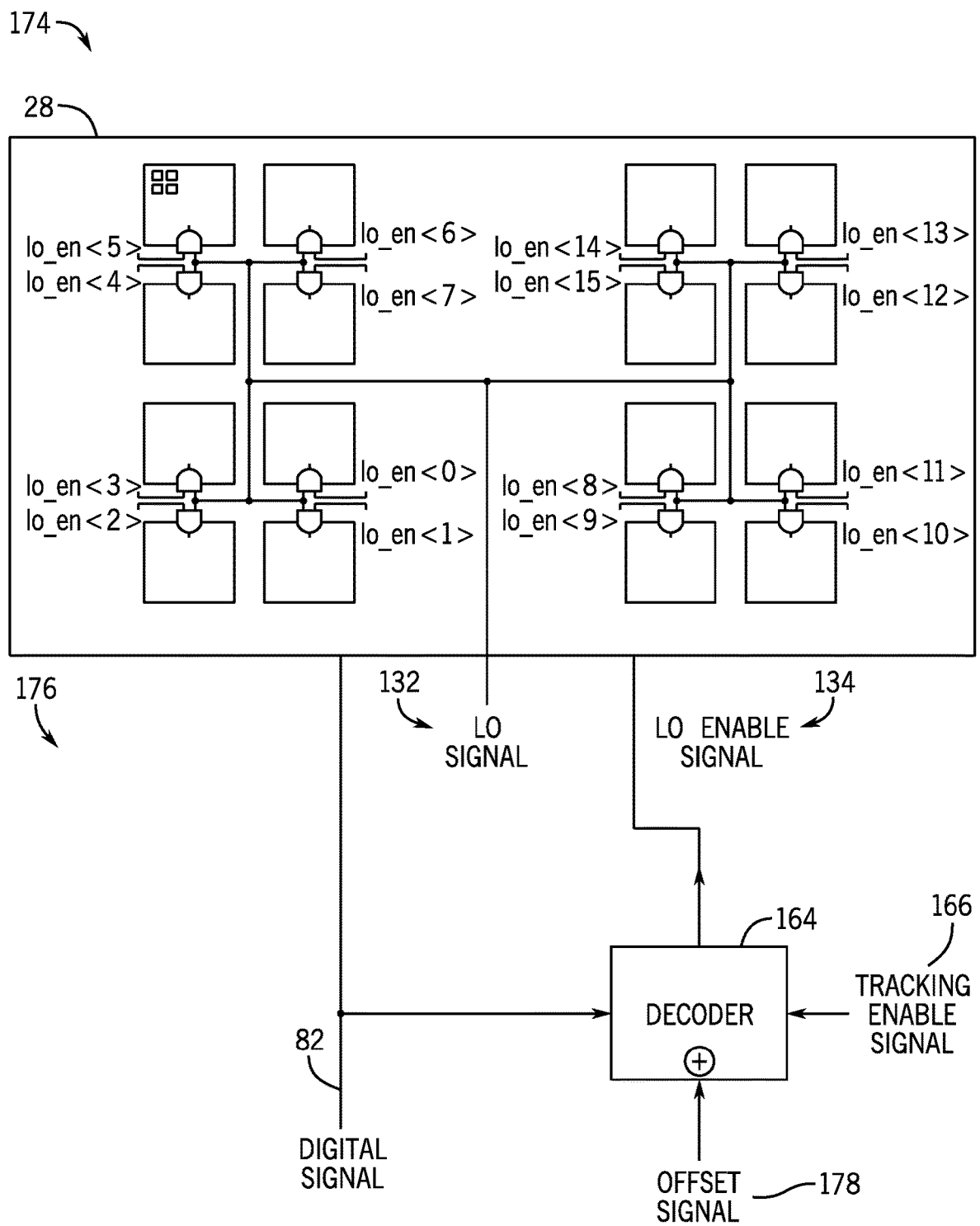
FIG. 18 is a diagrammatic representation of a digital to analog converter and local oscillator tracking circuitry, in accordance with an embodiment.

The LO buffer tile 170 may provide decreased noise. For example, the newly activated LO buffer tile 170 may have time 144 to enable and settle before being utilized with activated unit cells 102. Additionally, the dynamic LO tracking with +n offset may provide decreased power usage over static LO tracking, as the number of activated LO tiles 146, in the aggregate of time 144, is reduced. Although illustrated with a +1 offset, as should be appreciated, the amount of offset may be any suitable amount, and may be based on implementation (e.g., rate of change of the digital signal 82, update frequency of the digital signal 82, etc.). FIG. 18 is an example circuit diagram 174 including the DAC 28 and LO tracking circuitry 176. The decoder 164 of the LO tracking circuitry 176 associated with dynamic LO tracking with +n offset may receive the digital signal 82 to determine the LO enable signal 134. In some embodiments, the decoder 164 may receive an offset signal 178 indicative of how many LO buffer tiles 170 to use at a given time. For example, the offset signal 178 may be based on preset values, the digital signal 82, and/or signal statistics such as a frequency or derivative of the digital signal 82. Additionally or alternatively, the LO tracking circuitry 176 may receive the tracking enable signal 166 to enable or disable dynamic LO tracking with the +n offset and/or enable or disable the +n offset.

Figure 19:
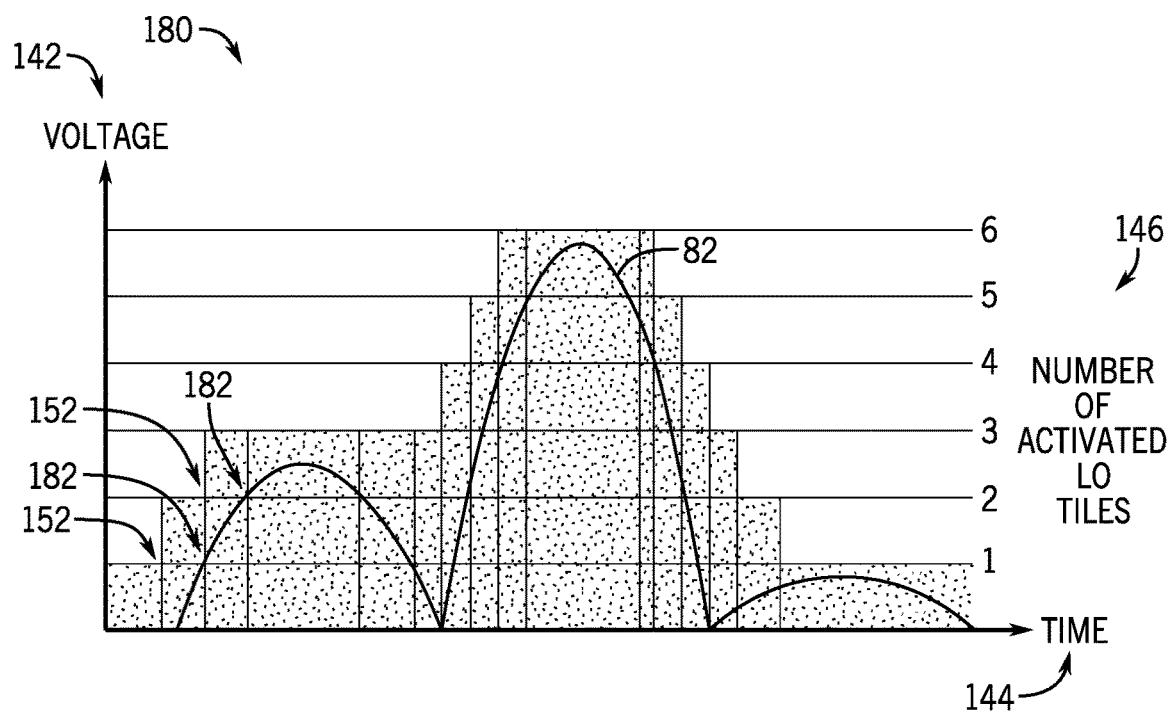
FIG. 19 is a graph of an example digital signal over time and the number of activated local oscillator tiles associated with a dynamic tracking scheme, in accordance with an embodiment.
Figure 20:
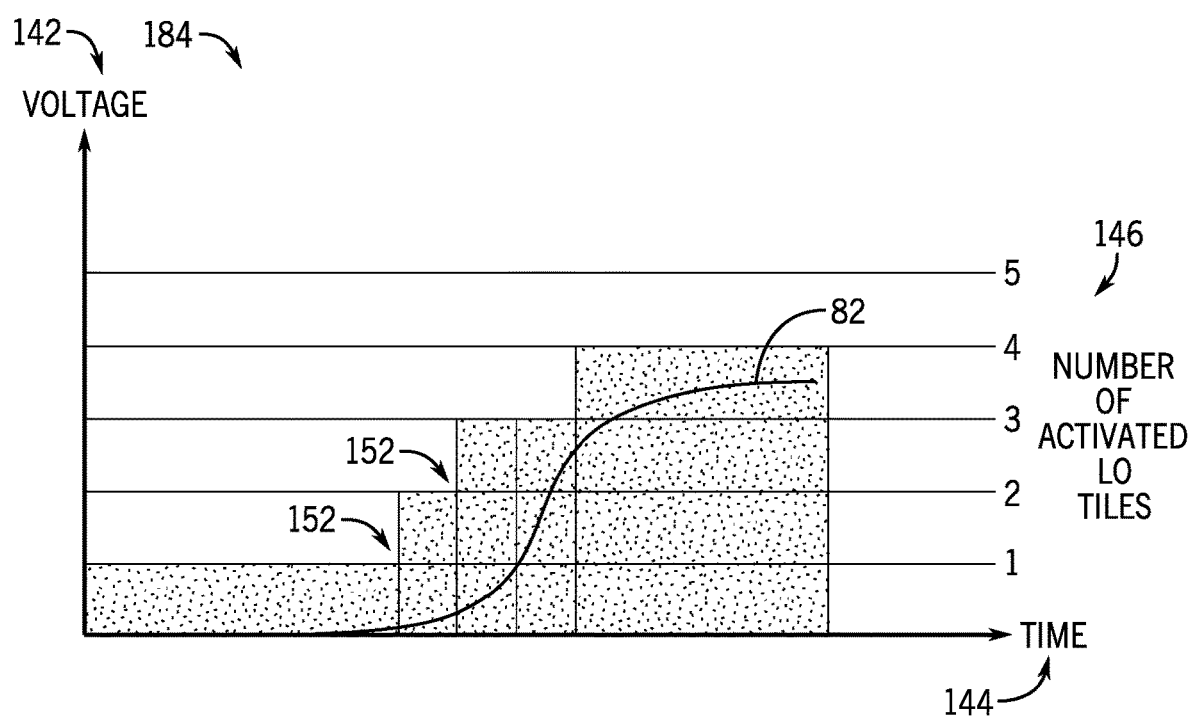
FIG. 20 is a graph of an example digital signal over time and the number of activated local oscillator tiles associated with a dynamic tracking scheme, in accordance with an embodiment.

In some scenarios, the digital signal 82 may jump faster than the preset or determined offset. In some embodiments, dynamic LO tracking may include looking ahead at the digital signal 82 to preemptively turn on LO tiles 130 just before they are needed. For example, FIG. 19 is a graph 180 of the representative voltage 142 (i.e., on the y-axis) of an example digital signal 82 over time 144 (i.e., on the x-axis) with the number of activated LO tiles 146 shaded in the y-axis direction according to a dynamic LO tracking scheme with look-ahead. In some embodiments, the digital signal 82 may be delayed by one or more clock cycles such that changes 182 to the digital signal 82 may be anticipated. For example, by looking ahead (e.g., operating one or more cycles behind) changes 182 to the digital signal 82 that correspond to activation of an LO tile 130 are foreseen, and one or more LO tiles 130 may be activated in advance at LO tile increase points 152. In some embodiments, dynamic LO tracking with look-ahead may also review recently past clock cycles and maintain unused LO tiles 130 for one or more clock cycles, for example, to reduce toggling. Looking ahead by multiple clock cycles (e.g., samples) may also be utilized to smooth larger LO tile increases, such as in the graph 184 of FIG. 20. The graph 184 includes the representative voltage 142 (i.e., on the y-axis) of an example digital signal 82 over time 144 (i.e., on the x-axis) with the number of activated LO tiles 146 shaded in the y-axis direction according to a dynamic LO tracking scheme with multiple clock look-ahead. In some embodiments, the dynamic LO tracking with multiple clock look-ahead may include LO tile increase points 152 in stages. For example, the digital signal 82 may increase (or decrease) quickly, and the multiple clock look-ahead may allow for the LO tile increase points 152 to be spread out instead of causing multiple LO tiles 130 to be enabled simultaneously. Such staggering may assist in reducing noise, reducing peak power consumption, and/or reducing overall power consumption.

Figure 21:
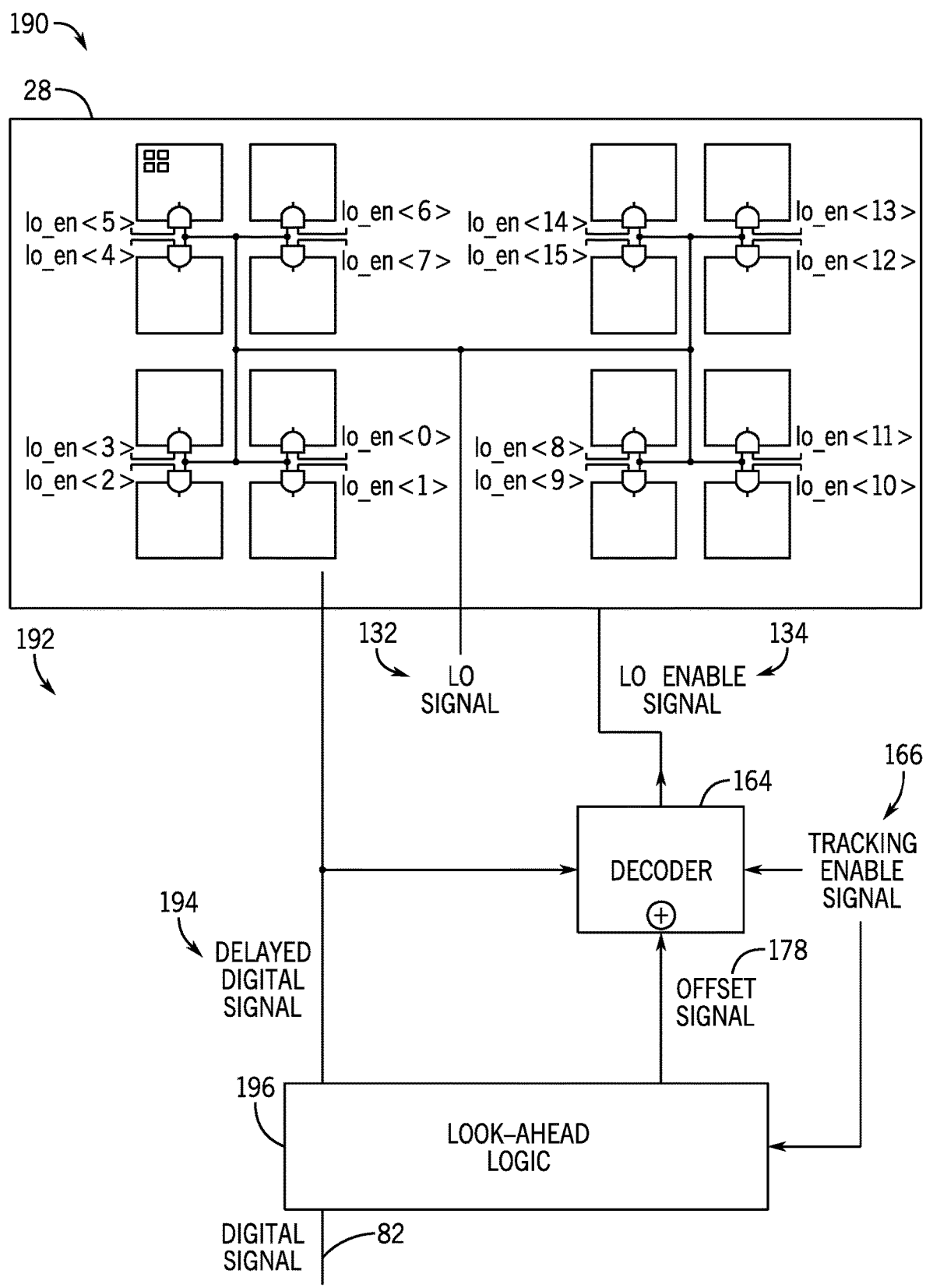
FIG. 21 is a diagrammatic representation of a digital to analog converter and local oscillator tracking circuitry, in accordance with an embodiment.

FIG. 21 is an example circuit diagram 190 including the DAC 28 and LO tracking circuitry 192. The decoder 164 of the LO tracking circuitry 192 associated with dynamic LO tracking with look-ahead may receive a delayed digital signal 194 to determine the LO enable signal 134. In some embodiments, the decoder 164 may receive an offset signal 178 indicative of anticipated LO tiles 130 from look-ahead logic 196. In some embodiments, the look-ahead logic 196 may receive the digital signal 82 and determine the offset signal 178 and delayed digital signal 194. As should be appreciated, the look-ahead logic 196 may delay the digital signal 82 any suitable number of clock cycles or samples and determine an appropriate offset signal 178 corresponding to the delayed digital signal 194. Furthermore, in some embodiments, the tracking enable signal 166 may be used to enable or disable the LO tracking circuitry 192 (e.g., the decoder 164 and/or look-ahead logic 196), for example, to reduce power consumption when not in use.

Figure 22:
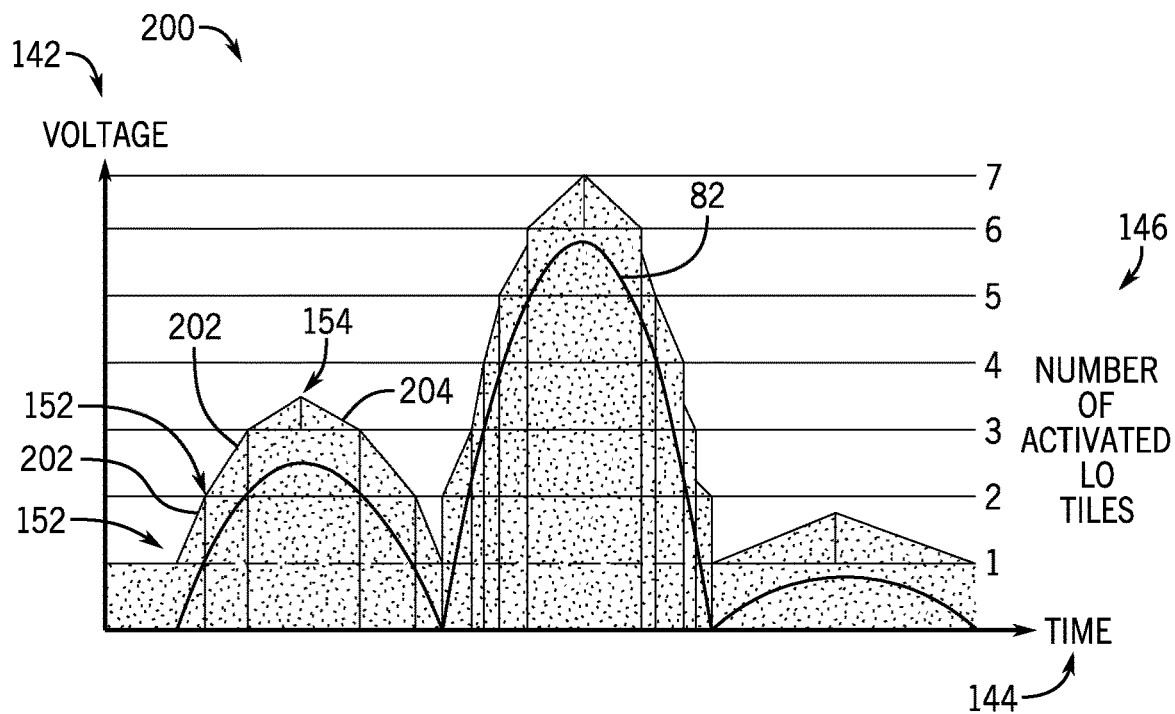
FIG. 22 is a graph of an example digital signal over time and the number of activated local oscillator tiles associated with a dynamic tracking scheme, in accordance with an embodiment.

As discussed herein, the increases and/or decreases of the number of activated LO tiles 146 may correspond to current jumps and/or noise associated with the DAC 28. The current jumps may result in non-linearities due to the step-wise current profile of the LO current and/or voltage distribution. In some embodiments, the current profile of increasing and/or decreasing the number of activated LO tiles 146 may be linearized, at least in part, by implementing current bleeding to smooth the current profile. For example, FIG. 22 is a graph 200 including the representative voltage 142 (i.e., on the y-axis) of an example digital signal 82 over time 144 (i.e., on the x-axis) with the number of activated LO tiles 146 shaded in the y-axis direction according to a dynamic LO tracking scheme with current bleeding. By utilizing current bleeding, the LO tile increase points 152 and LO tile decrease points 154 may form linearized increases 202 and linearized decreases 204, respectively. The bleed current may smooth out the stepped profile of LO tile increases and provide reduced noise and increased smoothness for the analog output signal 90.

Figure 23:
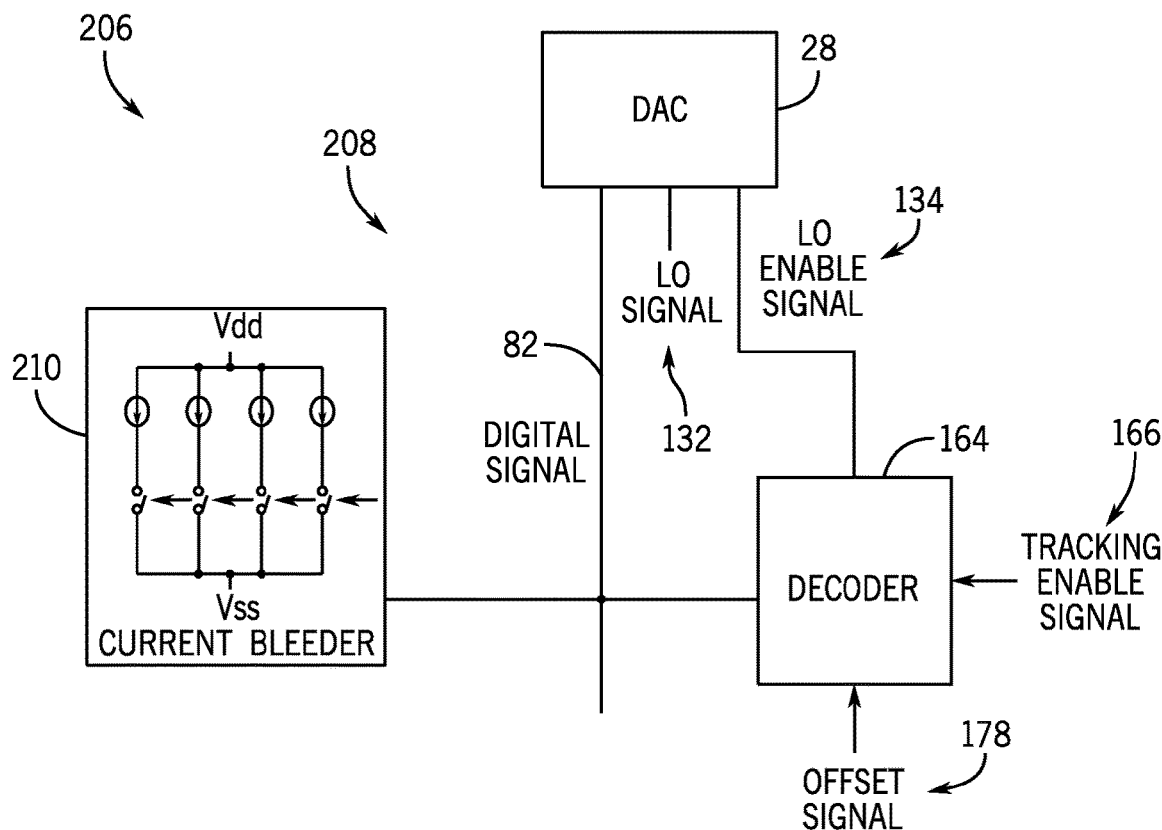
FIG. 23 is a diagrammatic representation of a digital to analog converter and local oscillator tracking circuitry, in accordance with an embodiment.

FIG. 23 is an example circuit diagram 206 including the DAC 28 and LO tracking circuitry 208. In some embodiments, decoder 164 of the LO tracking circuitry 208 associated with dynamic LO tracking with current bleeding may also include a current bleed circuit 210 to provide the linearized increases/decreases in the number of activated LO tiles 146. The current bleed circuit 210 may be connected to one or more least-significant-bits (LSBs) of the digital signal 82 provided to the decoder 164. The LSBs may represent the finer changes in the digital signal 82, which may help linearize the changes in the number of activated LO tiles 146. Additionally, any suitable current bleed circuit 210 may be used, such as a current bleed circuit 210 based on direct current (DC) current, switching capacitors, a thermometric bleed circuitry, and/or a bleed circuit with different segmentations. Further, in some embodiments, multiple current bleed circuits 210 may be utilized. For example, when implemented with look-ahead logic 196, it may be desired to utilize multiple current bleed circuits 210 due to the potential reliance on past, present, and/or future clock cycles or samples, which may generate an interrelated LO enable signal 134 that is non-linear with the digital signal 82.

As discussed herein the techniques and components of the LO tracking circuitry 162, 176, and/or 208 may be implemented individually, together, or may be selectable (e.g., based on a tracking enable signal 166). For example, the current bleed circuit 210 may be implemented with a decoder 164 with or without +n LO buffer tiles 170 and/or look-ahead logic 196. Furthermore, each component and/or its associated dynamic LO tracking scheme may be enabled or disabled (e.g., via the tracking enable signal 166) based on implementation and desired levels of power savings and/or acceptable noise. For example, look-ahead logic 196 may be implemented with a current bleed circuit 210 and one or the other may be selectively enabled. Additionally, as discussed above, the present techniques may be implemented in a column and line DAC 114 and/or a fractal DAC 100.

Figure 24:
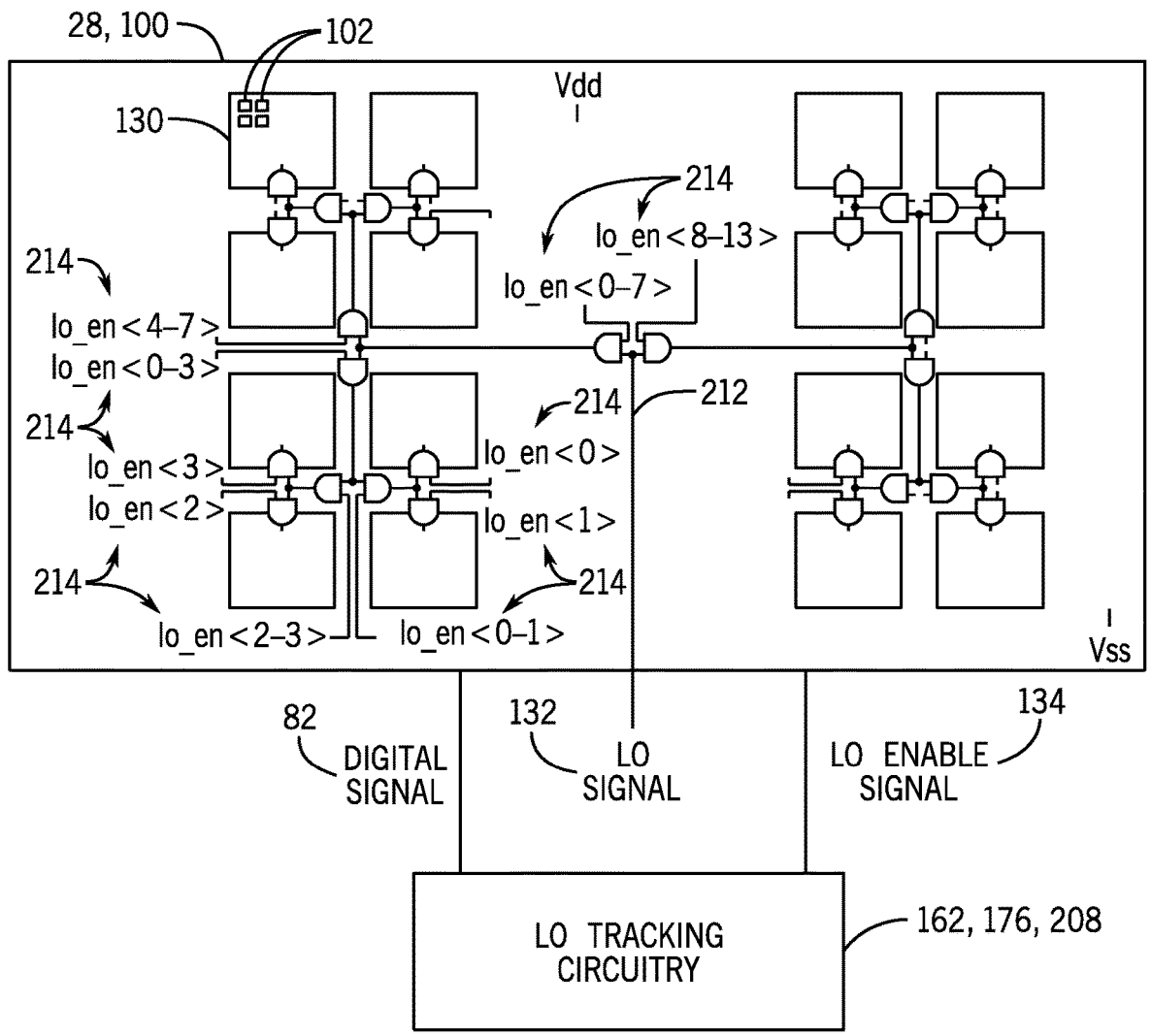
FIG. 24 is a diagrammatic representation of a fractal digital to analog converter and local oscillator tracking circuitry, in accordance with an embodiment.

In some embodiments, the LO enable signal 134 and/or LO signal 132 may be distributed to the LO tiles 130 via a distribution tree 212 similar to that of the fractal DAC 100 as shown in FIG. 24. For example, distribution logic 214 may be organized such that the arrival time of the LO signal 132 and/or LO enable signal 134 at each of the LO tiles 130 are each substantially the same, which may provide more synchronous, smooth, and/or faster analog output signals 90. Additionally or alternatively, the distribution logic 214 may deactivate multiple LO tiles 130 as early as feasible, as determined by the LO enable signal 134, allowing for entire branches of the distribution tree 212 including the data paths to be deactivated, which may save power and increase efficiency.

Figure 25:
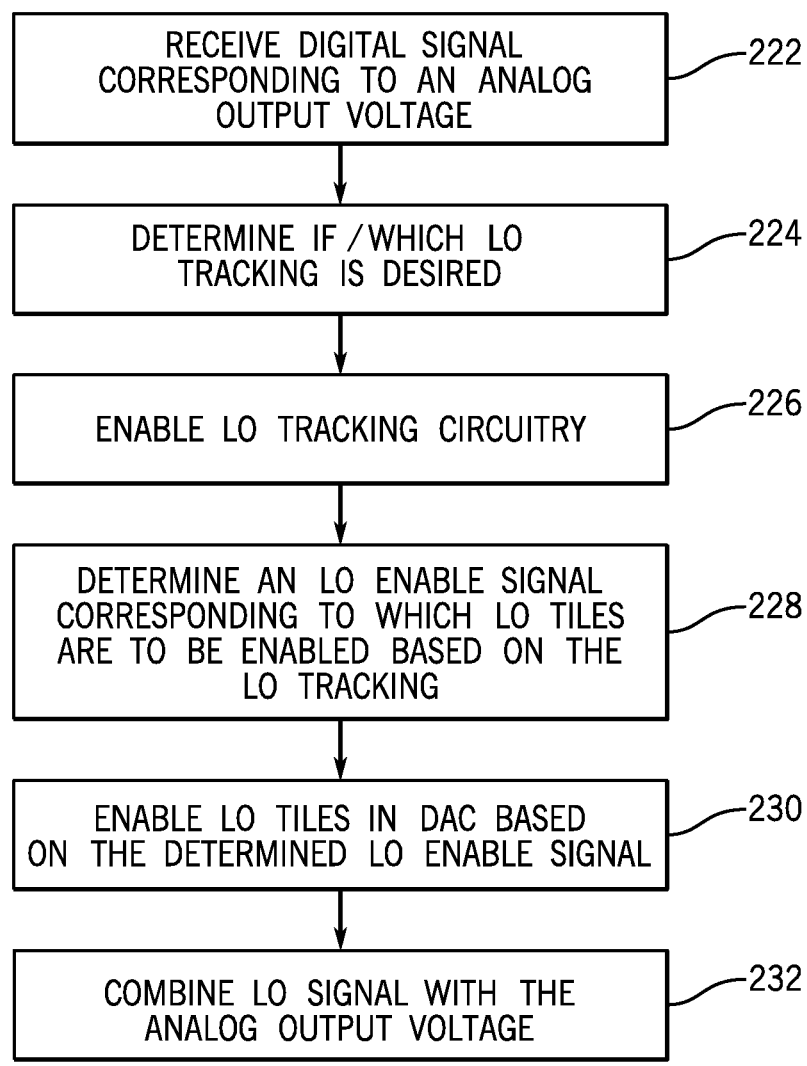
FIG. 25 is a flowchart of an example process for operating a digital to analog converter with selectable dynamic LO tracking, in accordance with an embodiment.

FIG. 25 is a flowchart 220 of an example process for operating a DAC 28 with selectable dynamic LO tracking. The DAC 28 may receive a digital signal 82 corresponding to a desired analog output signal 90 (process block 222). Additionally, based on a preset configuration, the digital signal 82, a derivative of (e.g., statistic relating to) the digital signal 82, a key performance indicator, or a combination thereof, the LO tracking circuitry 162, 176, 208 may determine if and/or which LO tracking is desired (process block 224), for example, based on the tracking enable signal 166. In some embodiments, depending on implementation, a threshold acceptable noise level (e.g., signal-to-noise ratio) and/or a threshold power efficiency may be taken into account to determine which LO tracking (e.g., static, dynamic, with +n, with look-ahead, with current bleeding, or a combination thereof) is desired. Furthermore, selection of static, dynamic, and/or the type of LO tracking may be based on a mode request such as a high performance mode request, a low power mode request, or an intermediate mode request. The mode request may be based on a user input, environmental conditions, and/or presets for certain operations. For example, certain signals generated by the DAC 28 may be preset to be generated in a higher performance mode, while other signals are preset to be generated in a lower power mode relative to other modes.

Based on the tracking enable signal 166, the LO tracking circuitry 162, 176, 208 may be enabled (process block 226) and determine an LO enable signal 134 corresponding which LO tiles 130 are to be enabled, based on the LO tracking (process block 228). Based on the LO enable signal 134, the corresponding LO tiles 130 in the DAC 28 may be enabled (process block 230) and the LO signal 132 may be combined with the analog output signal 90 of the unit cells 102 (process block 232).

Although the above referenced flowcharts 92 and 220 are shown in a given order, in certain embodiments, process blocks may be reordered, altered, deleted, and/or occur simultaneously. Additionally, the referenced flowcharts 92 and 220 are given as illustrative tools and further decision and process blocks may also be added depending on implementation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:
1. An electronic device comprising:
digital circuitry configured to output a digital signal;
a digital to analog converter (DAC) configured to convert the digital signal into a modulated analog signal,
wherein the DAC comprises:
a plurality of unit cells configured to generate an analog signal corresponding to the digital signal; and a plurality of local oscillator (LO) tiles configured to combine the analog signal with an LO signal to generate the modulated analog signal; and LO circuitry configured to dynamically adjust an LO enable signal based at least in part on the digital signal, wherein the LO enable signal is configured to enable a reduced number of LO tiles supporting one or more respective sets of unit cells of the plurality of unit cells operatively enabled based at least in part on the digital signal.

2. The electronic device of claim 1, wherein the LO circuitry comprises a decoder configured to generate the LO enable signal based at least in part on one or more most-significant-bits (MSBs) of the digital signal.

3. The electronic device of claim 2, wherein the decoder comprises a binary to thermometric decoder.

4. The electronic device of claim 1, wherein the DAC comprises a fractal DAC, wherein the plurality of LO tiles are arranged in a fractal physical organization.

5. The electronic device of claim 4, wherein the fractal DAC comprises a fractal distribution tree configured to selectively enable branches of the fractal distribution tree feeding the plurality of LO tiles.

6. The electronic device of claim 1, wherein the plurality of unit cells are configured to output respective predetermined voltages in response to being enabled, wherein the analog signal comprises an aggregate of the respective predetermined voltages of the plurality of unit cells.

7. The electronic device of claim 1, wherein the reduced number of LO tiles comprises a minimum number of LO tiles needed to support the one or more respective sets of unit cells operatively enabled based at least in part on the digital signal.

8. The electronic device of claim 7, wherein the LO circuitry is configured to dynamically adjust the LO enable signal such that one or more LO buffer tiles are enabled in addition to the minimum number of LO tiles.

9. The electronic device of claim 1, wherein the LO circuitry comprises look-ahead circuitry configured to anticipate a number of LO tiles for a future sample period and enable the number of LO tiles prior to the future sample period.

10. The electronic device of claim 9, wherein the look-ahead circuitry is configured to delay the digital signal to the DAC.

11. The electronic device of claim 9, wherein the look-ahead circuitry is configured to anticipate multiple future sample periods and spread out increases or decreases in the number of LO tiles over multiple sample periods.

12. The electronic device of claim 1, wherein the LO circuitry comprises a bleeder circuit configured to linearize, at least partly, a current increase associated with enabling an LO tile of the plurality of LO tiles.

13. A digital to analog converter (DAC) comprising:
a plurality of unit cells configured to generate an analog signal based at least in part on a digital signal;
a plurality of local oscillator (LO) tiles configured to combine the analog signal with an LO signal to generate a modulated analog signal; and
LO tracking circuitry configured to:
dynamically adjust an LO enable signal in response to a first tracking enable signal, wherein the dynamically adjusted LO enable signal is configured to enable a set of LO tiles less than a total number of the plurality of LO tiles based at least in part on the digital signal, wherein the set of LO tiles support one or more respective sets of unit cells of the plurality of unit cells operatively enabled based at least in part on the digital signal; and
generate a static LO enable signal in response to a second tracking enable signal.

14. The DAC of claim 13, wherein the LO tracking circuitry comprises a bleeder circuit configured to smooth, at least partly, a current step up or step down associated with enabling or disabling, respectively, an LO tile of the plurality of LO tiles, wherein the bleeder circuit is configured to smooth the current step up or step down by adding or subtracting a bleed current to a current draw of the LO tile.

15. The DAC of claim 14, wherein the bleeder circuit is configured to bleed current to one or more LO tiles based on one or more least-significant-bits (LSBs) of the digital signal.

16. The DAC of claim 13, wherein the LO tracking circuitry comprises look-ahead circuitry configured to anticipate a number of LO tiles for a future sample period and dynamically adjust the LO enable signal to enable the number of LO tiles prior to the future sample period.

17. The DAC of claim 13, wherein the LO tracking circuitry is configured to dynamically adjust the LO enable signal such that a number of LO buffer tiles are enabled in addition to a minimum number of LO tiles needed to support the one or more respective sets of unit cells operatively enabled based at least in part on the digital signal wherein the number of LO buffer tiles is determined based at least in part on signal statistics corresponding to the digital signal.

18. The DAC of claim 13, wherein the first tracking enable signal is associated with a reduced power mode of the DAC relative to the second tracking enable signal, and wherein the second tracking enable signal is associated with an increased performance mode of the DAC relative to the first tracking enable signal.

19. The DAC of claim 13, wherein the DAC comprises a column and line DAC.

20. A method comprising:
receiving, via a digital to analog converter (DAC), a digital signal representative of an analog signal;
determining a local oscillator (LO) tracking scheme;
generating, via one or more unit cells of the DAC, the analog signal based at least in part on the digital signal;
determining an LO enable signal indicative of a number of LO tiles to enable based at least in part on the digital signal, wherein the LO tiles are configured to modulate the analog signal to generate a modulated analog signal;
enabling one or more LO tiles based at least in part on the LO enable signal; and
outputting the modulated analog signal.

21. The method of claim 20, comprising:
delaying the digital signal from the DAC;
anticipating a future LO tile demand based at least in part on the delayed digital signal; and
enabling the number of LO tiles that meets the future LO tile demand.

22. The method of claim 21, comprising linearizing, at least partly, an electrical current profile associated with enabling or disabling an LO tile by bleeding current based at least in part on the digital signal.

23. The method of claim 20, wherein the DAC is a fractal DAC, the method comprising routing the LO enable signal via a distribution tree of the fractal DAC.

24. The method of claim 20, wherein the LO tracking scheme is determined based at least in part on the digital signal.

25. The method of claim 20, wherein the number of LO tiles comprises:
- a minimum number of LO tiles needed to support the one or more unit cells generating the analog signal; and
- one or more LO buffer tiles in addition to the minimum number of LO tiles.

\* \* \* \* \*